US012813277B2

(12) United States Patent
Jang et al.

(10) Patent No.: US 12,813,277 B2
(45) Date of Patent: Nov. 24, 2026

(54) HIGHLY INTEGRATED SEMICONDUCTOR DEVICE CONTAINING MULTIPLE BONDED DIES

(71) Applicant: Samsung Electronics Co., Ltd., Suwon-si (KR)

(72) Inventors: Ae-Nee Jang, Suwon-si (KR); Jihoon Kim, Suwon-si (KR); Seungduk Baek, Suwon-si (KR); Hyuekjae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 581 days.

(21) Appl. No.: 18/315,689

(22) Filed: May 11, 2023

(65) Prior Publication Data

US 2024/0055372 A1 Feb. 15, 2024

(30) Foreign Application Priority Data

Aug. 11, 2022 (KR) ........................ 10-2022-0100481

(51) Int. Cl.
*H10B 80/00* (2026.01)
*H10W 42/00* (2026.01)
(Continued)

(52) U.S. Cl.
CPC .......... *H10W 42/121* (2026.01); *H10B 80/00* (2023.02); *H10W 90/00* (2026.01); (Continued)

(58) Field of Classification Search
CPC ............... H10W 42/121; H10W 80/00; H10W 72/0198; H01L 23/562; H01L 24/08; H10B 80/00
See application file for complete search history.

(56) References Cited

U.S. PATENT DOCUMENTS 7,026,235 B1 4/2006 Ben-Tzur et al.
8,664,763 B2 3/2014 Kagawa et al.
(Continued)

FOREIGN PATENT DOCUMENTS

JP 2006-332344 A 12/2006
KR 10-2319407 B1 11/2021
(Continued)

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

A semiconductor device includes a substrate and a lower die on the substrate. The lower die includes a first semiconductor substrate having a first device region and a first edge region therein, a first semiconductor element on the first device region, a first pad on the first device region and on the first semiconductor element, and a first interconnection structure connecting the first semiconductor element to the first pad. The first interconnection structure includes a first signal pattern on the first device region and connected to the first semiconductor element, a second signal pattern on the first device region and directly connected to the first pad, and a first dummy pattern at the same level as the second signal pattern and disposed on the first edge region. An upper die is provided, which is bonded to the lower die such that the first pad of the lower die is in contact with a second pad of the upper die.

20 Claims, 16 Drawing Sheets

(51) Int. Cl.
*H10W 90/00* (2026.01)
*H10W 72/00* (2026.01)
*H10W 72/90* (2026.01)
*H10W 80/00* (2026.01)
*H10W 90/20* (2026.01)

(52) U.S. Cl.
CPC .... *H10W 72/0198* (2026.01); *H10W 72/9226* (2026.01); *H10W 72/923* (2026.01); *H10W 72/932* (2026.01); *H10W 72/9415* (2026.01); *H10W 72/942* (2026.01); *H10W 72/944* (2026.01); *H10W 72/952* (2026.01); *H10W 72/953* (2026.01); *H10W 80/312* (2026.01); *H10W 90/297* (2026.01); *H10W 90/792* (2026.01)

(56) References Cited

U.S. PATENT DOCUMENTS

| | | | | |
|---|---|---|---|---|
| 8,703,542 | B2 | 4/2014 | Lin et al. | |
| 8,802,538 | B1 | 8/2014 | Liu et al. | |
| 9,142,517 | B2 | 9/2015 | Liu et al. | |
| 9,437,568 | B2 | 9/2016 | Kawasaki | |
| 10,050,018 | B2 * | 8/2018 | Wu ........................ | H10W 72/90 |
| 10,867,943 | B2 * | 12/2020 | Chen ...................... | H10W 90/00 |
| 11,177,307 | B2 | 11/2021 | Kao et al. | |
| 11,211,250 | B2 | 12/2021 | Sakamoto et al. | |
| 2008/0265399 | A1 * | 10/2008 | Chao ................. | H01L 23/49816 257/698 |
| 2021/0288029 | A1 | 9/2021 | Huang et al. | |

FOREIGN PATENT DOCUMENTS

| | | | |
|---|---|---|---|
| KR | 10-2022-0033619 | A | 3/2022 |
| TW | 202211328 | A | 3/2022 |
| TW | 202213769 | A | 4/2022 |

* cited by examiner

HIGHLY INTEGRATED SEMICONDUCTOR DEVICE CONTAINING MULTIPLE BONDED DIES

REFERENCE TO PRIORITY APPLICATION

This U.S. non-provisional patent application claims priority under 35 U.S.C. § 119 to Korean Patent Application No. 10-2022-0100481, filed Aug. 11, 2022, the disclosure of which is hereby incorporated herein by reference.

FIELD

The present disclosure relates to a directly-bonded semiconductor device and a method of fabricating the same.

BACKGROUND

In the semiconductor industry, various packaging technologies have been developed to meet increasing demands for semiconductor devices and/or an electronic products having larger capacities, smaller thicknesses, and reduced lateral dimensions. For example, a package technology of vertically stacking semiconductor chips has been suggested to realize a high-density chip stacking structure. This technology makes it possible to integrate semiconductor chips of various functions within a small area, compared with a typical package structure including only a single semiconductor chip.

A semiconductor package includes a semiconductor chip that is provided to be easily used as a part of an electronic product. In general, the semiconductor package includes a printed circuit board (PCB) and a semiconductor chip, which is mounted on the PCB and is electrically connected to the PCB using bonding wires or bumps. With the development of the electronic industry, various studies are being conducted to improve reliability and durability of the semiconductor package.

SUMMARY

Some embodiments of the inventive concept provide semiconductor devices having improved structural stability, and methods of fabricating the same.

Some embodiments of the inventive concept provide methods of reducing failures during a process of fabricating semiconductor devices and semiconductor devices fabricated thereby.

Some embodiments of the inventive concept provide semiconductor devices having improved electrical characteristics and improved driving stability, and methods of fabricating the same.

According to an embodiment of the inventive concept, a semiconductor device may include a substrate, a lower die on the substrate, and an upper die on the lower die. The lower die may include a first semiconductor substrate including a first device region and a first edge region, a first semiconductor element provided on the first device region of the first semiconductor substrate, a first pad provided on the first device region and on the first semiconductor element, and a first interconnection structure connecting the first semiconductor element to the first pad. The first interconnection structure may include a first signal pattern provided on the first device region and connected to the first semiconductor element, a second signal pattern provided on the first device region and directly connected to the first pad, and a first dummy pattern provided at the same level as the second signal pattern and disposed on the first edge region. The upper die and the lower die may be bonded to each other such that the first pad of the lower die is in contact with a second pad of the upper die.

According to another embodiment of the inventive concept, a semiconductor device may include a substrate, a plurality of semiconductor dies stacked on the substrate, and a mold layer provided on the substrate to enclose the dies. Each of the dies may include a semiconductor substrate having a first surface and a second surface, which are opposite to each other, a semiconductor element provided on the first surface of the semiconductor substrate, a first pad on the semiconductor element, an interconnection pattern connecting the semiconductor element to the first pad, a guard ring structure, which is provided on the first surface of the semiconductor substrate and is closer to a side surface of the semiconductor substrate than the interconnection pattern, a dummy pattern extending on the guard ring structure, and a second pad provided on the second surface of the semiconductor substrate. The dies, which are vertically adjacent to each other, may be bonded to be in direct contact with each other, and the uppermost top surface of the interconnection pattern may be at the same level as a top surface of the dummy pattern (e.g., coplanar).

According to a further embodiment of the inventive concept, a semiconductor device may include a lower structure and an upper structure on the lower structure. The lower structure may include a first semiconductor substrate having a first device region and a first edge region, a first semiconductor element provided on the first semiconductor substrate, a first pad extending on the first semiconductor element, a first signal pattern directly connected to a bottom surface of the first pad, and a first dummy pattern disposed at a side of the first signal pattern. The first semiconductor element and the first signal pattern may extend on the first device region, and the first dummy pattern may extend on the first edge region. The upper structure and the lower structure may be bonded to each other, and the first pad of the lower structure and a second pad of the upper structure may be in contact with each other to form a single object. The first semiconductor element and the first signal pattern may be spaced apart from the first edge region.

DETAILED DESCRIPTION

Example embodiments of the inventive concepts will now be described more fully with reference to the accompanying drawings, in which example embodiments are shown.

Figure 1:
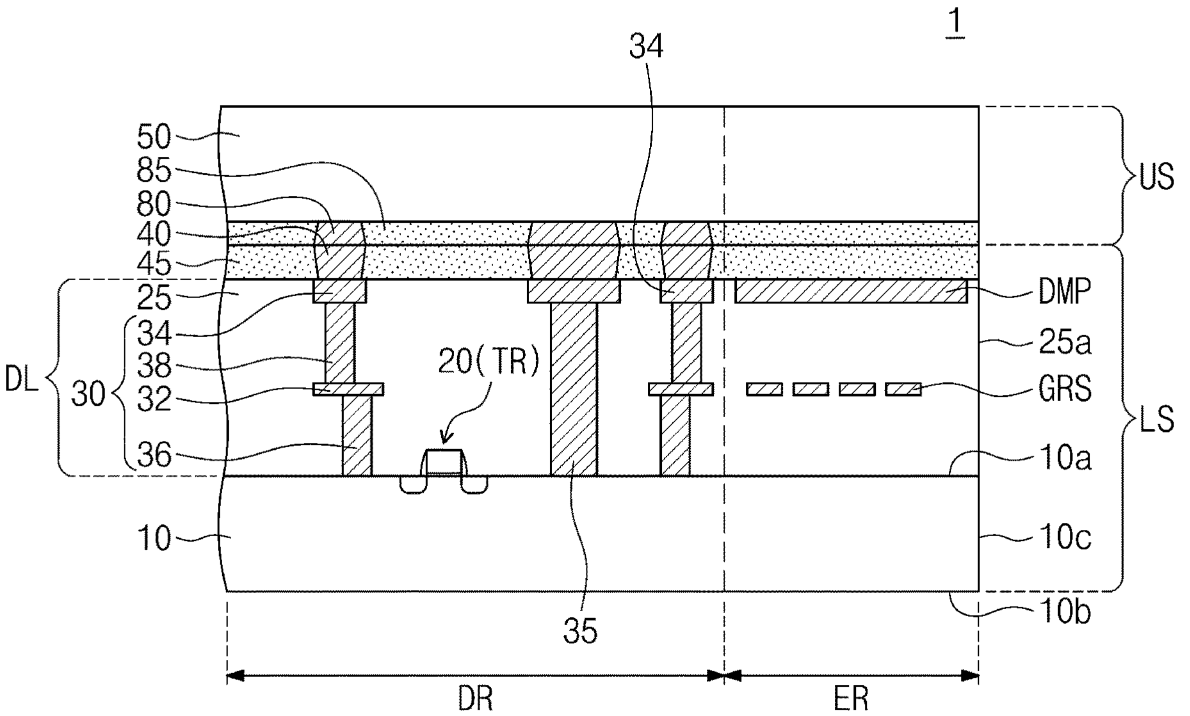
FIG. 1 is a sectional view illustrating a semiconductor device according to an embodiment of the inventive concept.
Figure 2:
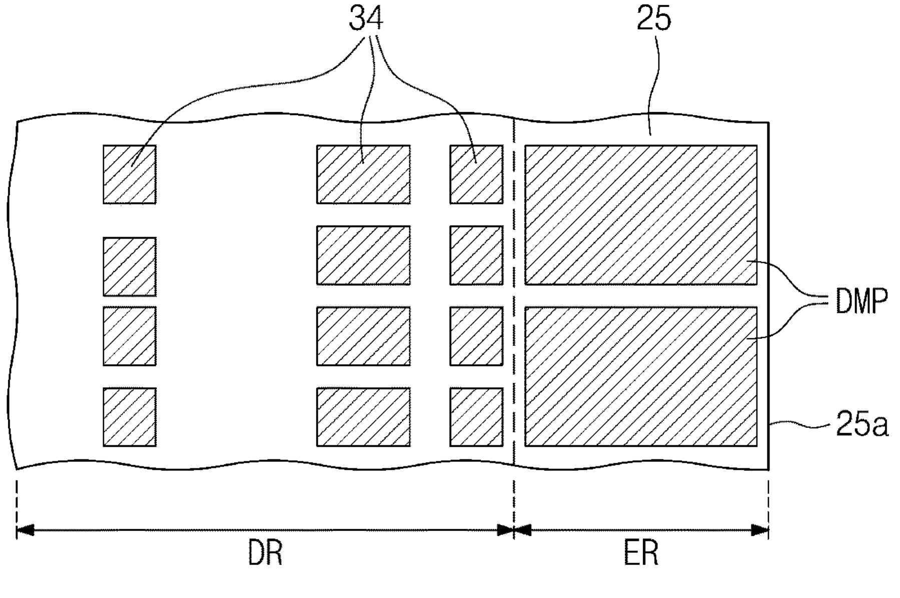
FIG. 2 is a plan view illustrating a semiconductor device according to an embodiment of the inventive concept, which corresponds to the sectional view of FIG. 1.

FIG. 1 is a sectional view illustrating a semiconductor device according to an embodiment of the inventive concept, whereas FIG. 2 is a plan view illustrating a semiconductor device according to an embodiment of the inventive concept. Referring to FIGS. 1 and 2, a semiconductor device 1 may include a lower structure LS and an upper structure US. The lower structure LS may include a first semiconductor substrate 10 and a circuit structure, which is disposed on the first semiconductor substrate 10. In an embodiment, the lower structure LS may correspond to a single semiconductor die. The first semiconductor substrate 10 may be formed of or include a semiconductor material. For example, the first semiconductor substrate 10 may be a single-crystalline silicon wafer.

The first semiconductor substrate 10 may include a device region DR and an edge region ER. When viewed in a plan view, the device region DR may be placed at a center region of the first semiconductor substrate 10, and the edge region ER may be provided to enclose the device region DR. The first semiconductor substrate 10 may have a first surface 10*a* and a second surface 10*b*, which are opposite to each other. The first surface 10*a* of the first semiconductor substrate 10 may be a front surface of the first semiconductor substrate 10, and the second surface 10*b* may be a rear surface of the first semiconductor substrate 10. Here, the front surface 10*a* may be a surface of the first semiconductor substrate 10, on which semiconductor elements, interconnection lines, or pads are integrated or formed, and the rear surface 10*b* may be an opposite surface of the first semiconductor substrate 10, which is opposite to the front surface.

The circuit structure may be disposed on the first semiconductor substrate 10. The circuit structure may include a device layer DL and a protection layer 45, which are sequentially stacked on the first surface 10*a* of the first semiconductor substrate 10. The device layer DL may include a semiconductor element 20 and a device interconnection structure 30. The semiconductor element 20 may include transistors TR, which are provided on the first surface 10*a* of the first semiconductor substrate 10 and in the device region DR. For example, the transistors TR may include source and drain electrodes, which are formed in an upper portion of the first semiconductor substrate 10, a gate electrode, which is disposed on the first surface 10*a* of the first semiconductor substrate 10, and a gate insulating layer, which is interposed between the first semiconductor substrate 10 and the gate electrode. FIG. 1 illustrates an example, in which one transistor TR is provided, but the inventive concept is not limited to this example. The semiconductor element 20 may include a plurality of transistors TR. In an embodiment, although not shown, the semiconductor element 20 may be composed of a shallow device isolation pattern, a logic cell, or a plurality of memory cells, which are provided in the device region DR and on the first surface 10*a*. Alternatively, the semiconductor element 20 may include a passive device (e.g., a capacitor). The semiconductor element 20 may not be disposed on the edge region ER of the first semiconductor substrate 10.

The first surface 10*a* of the first semiconductor substrate 10 may be covered with a device-interlayer insulating layer 25. The semiconductor element 20 may be buried in the device-interlayer insulating layer 25, which is provided on the device region DR. Here, the device-interlayer insulating layer 25 may cover the semiconductor element 20 in a downward direction. In other words, the semiconductor element 20 may not be exposed to the outside, due to the device-interlayer insulating layer 25. A side surface 25*a* of the device-interlayer insulating layer 25 may be aligned to a side surface 10*c* of the first semiconductor substrate 10. For example, the side surface 25*a* of the device-interlayer insulating layer 25 may be coplanar with the side surface 10*c* of the first semiconductor substrate 10. The device-interlayer insulating layer 25 may be formed of or include at least one of, for example, silicon oxide (SiO), silicon nitride (SiN), or silicon oxynitride (SiON). Alternatively, the device-interlayer insulating layer 25 may be formed of or include at least one low-k dielectric materials. The device-interlayer insulating layer 25 may have a single-layer or multi-layered structure. In the case where the device-interlayer insulating layer 25 has the multi-layered structure, each of interconnection layers, which will be described below, may be provided in a corresponding one of the insulating layers, and an etch stop layer may be interposed between the insulating layers. For example, the etch stop layer may be provided on bottom surfaces of the insulating layers. The etch stop layer may be formed of or include at least one of, for example, silicon nitride (SiN), silicon oxynitride (SiON), or silicon carbonitride (SiCN).

The device interconnection structure 30, which is connected to the transistors TR, may be provided on the device region DR and in the device-interlayer insulating layer 25. The device interconnection structure 30 may include first signal line patterns 32, which are buried in the device-interlayer insulating layer 25, and second signal line patterns 34, which are provided on the first signal line patterns 32. Each of the first and second signal line patterns 32 and 34 may be a pattern which is used as a part of a horizontal interconnection structure. The first signal line patterns 32 may be located between top and bottom surfaces of the device-interlayer insulating layer 25. The second signal line patterns 34 may be disposed in an upper portion of the device-interlayer insulating layer 25. For example, top surfaces of the second signal line patterns 34 may be exposed to the outside of the device-interlayer insulating layer 25 near the top surface of the device-interlayer insulating layer 25. For example, the second signal line patterns 34 may be an interconnection pattern, which is provided as the uppermost pattern of the device interconnection structure 30 in the device-interlayer insulating layer 25. A thickness of the second signal line patterns 34 may be larger than a thickness of the first signal line patterns 32. For example, the thickness of the second signal line patterns 34 may range from 1 μm to 10 μm. The first signal line patterns 32 and the second signal line patterns 34 may not be provided on the edge region ER. The first signal line patterns 32 and the second signal line patterns 34 may be formed of or include at least one of, for example, copper (Cu) or tungsten (W).

The device interconnection structure 30 may further include first connection contacts 36, which are provided to connect the first signal line patterns 32 to the semiconductor element 20 or to connect the first signal line patterns 32 to the first semiconductor substrate 10, and second connection contacts 38, which are provided to connect the first signal line patterns 32 to the second signal line patterns 34. Each of the first and second connection contacts 36 and 38 may be a pattern which is used as a part of a vertical interconnection structure. The first connection contact 36 may be provided to vertically penetrate the device-interlayer insulating layer 25 and may be connected to a source, drain, or gate electrode of one of the transistors TR. Alternatively, the first connection contacts 36 may be connected to various elements, which are used as the semiconductor elements 20. The first connection contacts 36 may be provided to vertically penetrate the device-interlayer insulating layer 25 and may be coupled to bottom surfaces of the first signal line patterns 32. The second connection contacts 38 may be provided to vertically penetrate the device-interlayer insulating layer 25 and may be coupled to top surfaces of the first signal line patterns 32 and bottom surfaces of the second signal line patterns 34. The first and second connection contacts 36 and 38 may be formed of or include, for example, tungsten (W).

FIG. 1 illustrates an example, in which one interconnection layer (i.e., the first signal line pattern 32) is provided between the first semiconductor substrate 10 and the second signal line patterns 34, but the inventive concept is not limited to this example. In another embodiment, a plurality of interconnection layers may be provided between the first semiconductor substrate 10 and the second signal line patterns 34. For example, another interconnection patterns may be provided between the first signal line patterns 32 and the second signal line patterns 34 or between the first signal line patterns 32 and the first semiconductor substrate 10. In this case, the interconnection patterns, the first signal line patterns 32, and the second signal line patterns 34 may be electrically connected to each other using connection contacts. For brevity's sake, the description that follows will refer to the embodiment of FIG. 1.

The device interconnection structure 30 may further include a penetration electrode 35 connecting the first semiconductor substrate 10 to the second signal line patterns 34. The penetration electrode 35 may be a pattern which is used as a part of the vertical interconnection structure. The penetration electrode 35 may be provided to vertically penetrate the device-interlayer insulating layer 25 and may be connected to a source, drain, or gate electrode of one of the transistors TR. Alternatively, the penetration electrode 35 may be connected to various elements, which are used as the semiconductor elements 20. The penetration electrode 35 may be provided to vertically penetrate the device-interlayer insulating layer 25 and may be coupled to the bottom surfaces of the second signal line patterns 34. In an embodiment, the penetration electrode 35 may be formed of or include tungsten (W). In another embodiment, the penetration electrode 35 may be provided to vertically penetrate the device-interlayer insulating layer 25 and the first semiconductor substrate 10 and may be exposed to the outside of the first semiconductor substrate 10 near the bottom surface of the first semiconductor substrate 10.

Although not shown, a seed layer and/or a barrier layer may be provided on side and bottom surfaces of the first connection contact 36, the second connection contact 38, and the penetration electrode 35. The seed layer or the barrier layer may be interposed between the device-interlayer insulating layer 25 and the first connection contacts 36, the second connection contacts 38, and the penetration electrode 35. The seed layer may be formed of or include, for example, gold (Au). The barrier layer may be formed of or include at least one of, for example, titanium (Ti), titanium nitride (TiN), tantalum (Ta), tantalum nitride (TaN), or tungsten nitride (WN).

A guard ring structure GRS may be provided on the edge region ER and in the device-interlayer insulating layer 25. The guard ring structure GRS may be provided at the same level as the first signal line patterns 32 and may be formed of or include the same material as the first signal line patterns 32. For example, the first signal line patterns 32 and the guard ring structure GRS may be patterns, which are formed by patterning a single metal layer. When viewed in a plan view, the guard ring structure GRS may be provided to enclose the device region DR or to have a ring shape. The guard ring structure GRS may be electrically disconnected from the semiconductor element 20 and the first device interconnection structure 30. In addition, the guard ring structure GRS may be electrically disconnected from other elements or interconnection patterns in the semiconductor device 1. For example, in the semiconductor device 1, the guard ring structure GRS may be in an electrically-floated stated. However, the inventive concept is not limited to this example, and in an embodiment, the guard ring structure GRS may be connected to a ground circuit of the semiconductor device 1. The guard ring structure GRS may not be disposed on the device region DR of the first semiconductor substrate 10. The guard ring structure GRS may be configured to protect the semiconductor element 20 and the device interconnection structure 30 on the device region DR from moisture or physical crack.

A dummy pattern DMP may be provided on the edge region ER and in the device-interlayer insulating layer 25. The dummy pattern DMP may be disposed at a side of the second signal line pattern 34. In an embodiment, a plurality of the dummy patterns DMP may be provided, and here, each of the dummy patterns DMP may be located on one of side surfaces of the second signal line patterns 34. Hereinafter, the dummy patterns DMP will be described, based on one of the dummy patterns DMP.

The dummy pattern DMP may be provided at the same level as the second signal line patterns 34 and may be formed of or include the same material as the second signal line patterns 34. For example, the second signal line patterns 34 and the dummy pattern DMP may be patterns, which are formed by patterning a single metal layer. A thickness of the dummy pattern DMP may be equal to a thickness of the second signal line patterns 34. For example, the thickness of the dummy pattern DMP may range from 1 μm to 10 μm. A top surface of the dummy pattern DMP may be exposed to the outside of the device-interlayer insulating layer 25 near the top surface of the device-interlayer insulating layer 25. In other words, the top surface of the dummy pattern DMP may be coplanar with the top surface of the device-interlayer insulating layer 25. Here, the top surface of the dummy pattern DMP and the top surface of the device-interlayer insulating layer 25 may be substantially flat. The dummy pattern DMP may be located at a level higher than the guard ring structure GRS. The dummy pattern DMP may be placed over the guard ring structure GRS. The dummy pattern DMP on the edge region ER may be located between the second signal line patterns 34 and the side surface 10*c* of the first semiconductor substrate 10. The dummy pattern DMP may be placed at a position that is spaced apart from the side surface 10*c* of the first semiconductor substrate 10 in an inward direction (e.g., toward an inner portion of the first semiconductor substrate 10). In other words, the dummy pattern DMP may be spaced apart from the side surface 10*c* of the first semiconductor substrate 10. The dummy pattern DMP may be spaced apart from the second signal line patterns 34 (i.e., the device region DR). The dummy pattern DMP may have a plate shape. The dummy pattern DMP may be electrically disconnected from the semiconductor element 20 and the device interconnection structure 30. In addition, the dummy pattern DMP may be electrically disconnected from other elements or interconnection patterns in the semiconductor device 1. In other words, the dummy pattern DMP in the semiconductor device 1 may be in an electrically-floated stated. The dummy pattern DMP may not be disposed on the device region DR of the first semiconductor substrate 10.

According to an embodiment of the inventive concept, the dummy patterns DMP may be provided on the edge region ER of the first semiconductor substrate 10. In the case where an impact or stress is exerted on the semiconductor device 1 in a lateral direction, the dummy patterns DMP may be used as a partition wall relieving the impact or stress, and thus, the semiconductor element 20 may be protected from the impact or stress. In addition, the dummy patterns DMP, which have a large area and a plate shape, may prevent the edge region ER of the semiconductor device 1 from being deformed or bent in a process of fabricating the semiconductor device 1, and thus, it may be possible to provide the semiconductor device 1 with improved structural stability. The prevention of the deformation of the semiconductor device 1 by the dummy patterns DMP will be described in more detail with reference to a fabricating method of the semiconductor device 1 below.

The semiconductor element 20 (including the transistors TR), the device-interlayer insulating layer 25, and the device interconnection structure 30 may constitute the device layer DL.

First pads 40 may be disposed on the device-interlayer insulating layer 25. The first pads 40 may be disposed on the top surfaces of the second signal line patterns 34. The first pads 40 may be in direct contact with the top surfaces of the second signal line patterns 34. A width of the first pad 40 may decrease as a distance from the first semiconductor substrate 10 decrease. Alternatively, unlike that shown in FIG. 1, the width of the first pad 40 may be uniform, regardless of the distance from the first semiconductor substrate 10. A thickness of the first pad 40 may be substantially uniform. For example, the first pad 40 may have a plate shape. In another embodiment, each of the first pads 40 may include a via portion and a pad portion, which are sequentially stacked and are connected to each other to form a single object, and may have a T-shaped section. When viewed in a plan view, the first pads 40 may have a rectangular or circular shape. Alternatively, the planar shape of the first pads 40 may be elliptical or polygonal. However, the inventive concept is not limited to this example, and in an embodiment, the planar shape of the first pads 40 may be variously changed. The first pads 40 may be formed of or include at least one of metallic materials. As an example, the first pads 40 may be formed of or include copper (Cu).

The first pads 40 may be electrically connected to the semiconductor element 20. For example, as shown in FIG. 1, the first pads 40 on the device region DR may be coupled to top surfaces of the second signal line patterns 34 of the device interconnection structure 30. In other words, the second signal line pattern 34 may be an under-pad pattern, which is provided in the device-interlayer insulating layer 25. The device interconnection structure 30 in the device-interlayer insulating layer 25 may be vertically extended and may be coupled to the first pad 40. The second signal line pattern 34 may be provided to electrically connect the semiconductor element 20 to the first pad 40.

The first protection layer 45 may be disposed on the device-interlayer insulating layer 25. The first protection layer 45 on the top surface of the device-interlayer insulating layer 25 may cover the second signal line patterns 34 and the dummy patterns DMP. The first protection layer 45 on the top surface of the device-interlayer insulating layer 25 may enclose the first pads 40. The first pads 40 may be exposed to the outside of the first protection layer 45. For example, when viewed in a plan view, the first protection layer 45 may enclose the first pads 40 but may not cover the first pads 40. The first protection layer 45 may have a top surface that is coplanar with top surfaces of the first pads 40. The first protection layer 45 may be formed of or include at least one of high density plasma (HDP) oxide, undoped silicate glass (USG), tetraethyl orthosilicate (TEOS), silicon nitride (SiN), silicon oxide (SiO), silicon carbon carbide (SiOC), silicon oxynitride (SiON), or silicon carbonitride (SiCN). The first protection layer 45 may have a single- or multi-layered structure.

The first pads 40 in the first protection layer 45 may have a damascene structure. For example, each of the first pads 40 may further include a seed/barrier pattern covering side and bottom surfaces of the first pad 40. The seed/barrier pattern may be provided to conformally cover the side and bottom surfaces of the first pad 40. The seed/barrier patterns may be interposed between the first pads 40 and the first protection layer 45 and between the first pads 40 and the second signal line patterns 34. In the case where the seed/barrier pattern is used as a seed layer, the seed/barrier pattern may be formed of or include at least one of metallic materials (e.g., gold (Au)). In the case where the seed/barrier pattern is used as a barrier pattern, the seed/barrier patterns may be formed of or include at least one of metallic materials (e.g., titanium (Ti) and tantalum (Ta)) or metal nitride materials (e.g., titanium nitride (TiN) and tantalum nitride (TaN)).

The upper structure US may be provided on the lower structure LS. The upper structure US may include a second semiconductor substrate 50, a second protection layer 85, and second pads 80. The upper structure US may correspond to a single semiconductor die. The second semiconductor substrate 50 may be provided. The second semiconductor substrate 50 may be a semiconductor substrate (e.g., a semiconductor wafer). The second semiconductor substrate 50 may be a bulk silicon substrate, a silicon-on-insulator (SOI) substrate, a germanium (Ge) substrate, a germanium-on-insulator (GOI) substrate, a silicon-germanium (Si—Ge) substrate, or a substrate including an epitaxial thin film formed by a selective epitaxial growth (SEG). The second semiconductor substrate 50 may be formed of or include at least one of, for example, silicon (Si), germanium (Ge), silicon germanium (SiGe), gallium arsenic (GaAs), indium gallium arsenic (InGaAs), or aluminum gallium arsenic (AlGaAs). Alternatively, the second semiconductor substrate 50 may be an insulating substrate (e.g., a printed circuit board (PCB)). Although not shown, a semiconductor element (e.g., a transistor) may be provided on the second semiconductor substrate 50. In this case, the semiconductor element on the second semiconductor substrate 50 may be covered with a device-interlayered isolation layer.

The second pads 80 may be disposed on the second semiconductor substrate 50. The second pads 80 may be disposed on a bottom surface of the second semiconductor substrate 50 facing the lower structure LS. A width of the second pad 80 may decrease as a distance from the second semiconductor substrate 50 decreases. Alternatively, unlike that shown in FIG. 1, the width of the second pad 80 may be uniform, regardless of the distance from the second semiconductor substrate 50. A thickness of the second pad 80 may be substantially uniform. In other words, the second pads 80 may have a plate shape. In another embodiment, the second pad 80 may include a via portion and a pad portion, which are sequentially stacked and are connected to each other to form a single object, and may have a T-shaped section. When viewed in a plan view, the second pad 80 may have a rectangular or circular shape. Alternatively, the planar shape of the second pad 80 may be elliptical or polygonal. In an embodiment, a material of the second pads 80 may be substantially the same as a material of the first pads 40. The second pads 80 may be formed of or include at least one of metallic materials. For example, the second pads 80 may be formed of or include copper (Cu).

The second protection layer 85 may be disposed on the second semiconductor substrate 50. The second protection layer 85 may be provided on the bottom surface of the second semiconductor substrate 50 to enclose the second pads 80. Bottom surfaces of the second pads 80 may be exposed to the outside of the second protection layer 85. For example, when viewed in a plan view, the second protection layer 85 may be provided to enclose the second pads 80 but may not cover the second pads 80. The second protection layer 85 may have a bottom surface that is coplanar with the bottom surfaces of the second pads 80. The second protection layer 85 may be formed of or include at least one of oxide, nitride, or oxynitride materials, which include an element that is contained in the second semiconductor substrate 50. The second protection layer 85 may be formed of or include at least one of insulating materials (e.g., silicon oxide (SiO), silicon nitride (SiN), silicon oxynitride (SiON), or silicon carbonitride (SiCN)). For example, the second protection layer 85 may be formed of or include silicon oxide (SiO).

The upper structure US may be disposed on the lower structure LS, as shown. The first pads 40 of the lower structure LS may be vertically aligned to the second pads 80 of the upper structure US. The lower and upper structures LS and US may be in contact with each other.

At an interface between the lower and upper structures LS and US, the first protection layer 45 of the lower structure LS may be bonded to the second protection layer 85 of the upper structure US. Here, the first and second protection layers 45 and 85 may form a hybrid bonding structure of oxide, nitride, or oxynitride. In the present specification, the hybrid bonding structure may mean a bonding structure, in which two materials of the same kind are fused at an interface therebetween. For example, the first and second protection layers 45 and 85, which are bonded to each other, may have a continuous structure, and there may be no visible interface between the first and second protection layers 45 and 85. For example, the first and second protection layers 45 and 85 may be formed of the same material, and in this case, there may be no interface between the first and second protection layers 45 and 85. In other words, the first and second protection layers 45 and 85 may be provided as a single element. For example, the first and second protection layers 45 and 85 may be connected to form a single object. However, the inventive concept is not limited to this example. For example, the first and second protection layers 45 and 85 may be formed of different materials. In this case, the first and second protection layers 45 and 85 may not have a continuous structure, and there may be a visible interface between the first and second protection layers 45 and 85. The first and second protection layers 45 and 85 may not be bonded to each other, and each of the first and second protection layers 45 and 85 may be provided as an individual element. For brevity's sake, the description that follows will refer to the embodiment of FIGS. 1 and 2.

The upper structure US may be connected to the lower structure LS. In detail, the upper and lower structures US and LS may be in contact with each other. At the interface between the lower and upper structures LS and US, the first pads 40 of the lower structure LS may be bonded to the second pads 80 of the upper structure US. Here, the first and second pads 40 and 80 may form an inter-metal hybrid bonding structure. For example, the first and second pads 40 and 80, which are bonded to each other, may have a continuous structure, and there may be no visible interface between the first and second pads 40 and 80. For example, the first and second pads 40 and 80 may be formed of or include the same material, and there may be no interface between the first and second pads 40 and 80. In other words, the first and second pads 40 and 80 may be provided as a single element. For example, the first pads 40 and the second pads 80 may be bonded to form a single object.

According to an embodiment of the inventive concept, the dummy patterns DMP may be provided to prevent the lower structure LS from being deformed or bent, and thus, the lower structure LS may be provided to have a substantially flat top surface. Accordingly, in a process of bonding the lower and upper structures LS and US, it may be possible to reduce a separation between the lower and upper structures LS and US caused by a surface topology of the lower structure LS. For example, the lower and upper structures LS and US may be fully bonded to each other without any void therebetween. Accordingly, the lower and upper structures LS and US may be strongly bonded to each other, and thus, the structural stability of the semiconductor device 1 may be improved. In the description of the embodiments to be explained below, an element previously described with reference to FIGS. 1 and 2 may be identified by the same reference number without repeating an overlapping description thereof, for concise description.

Figure 3:
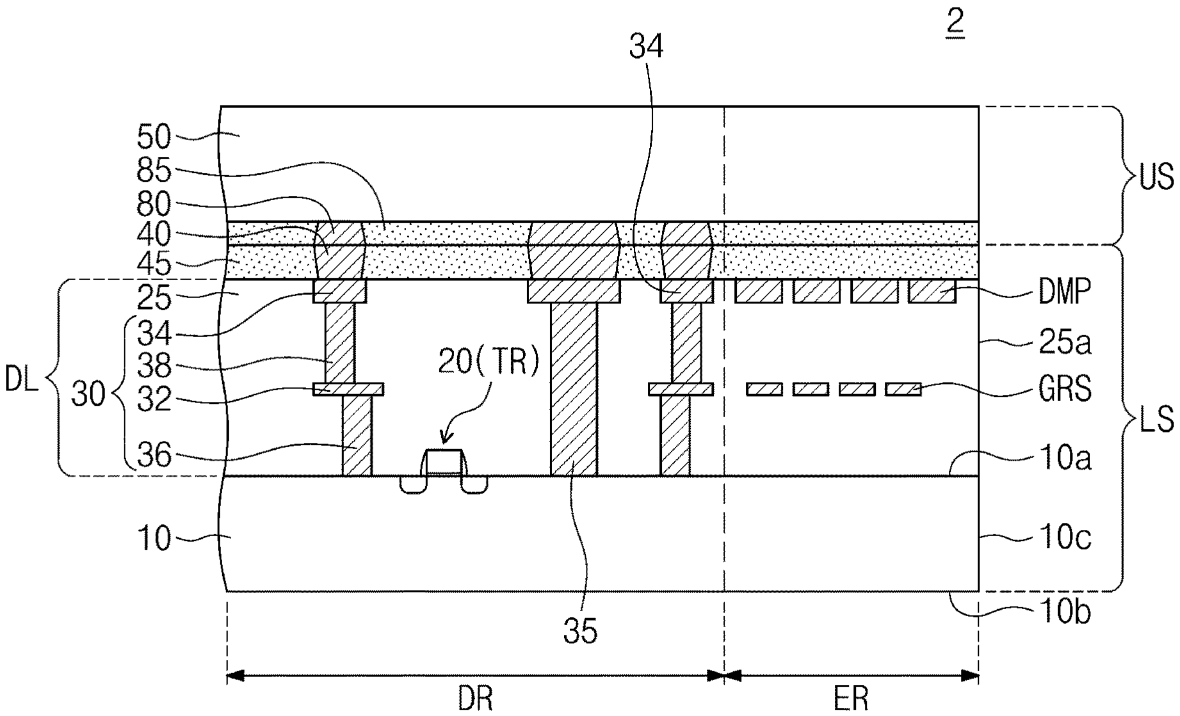
FIG. 3 is a sectional view illustrating a semiconductor device according to an embodiment of the inventive concept.
Figure 4:
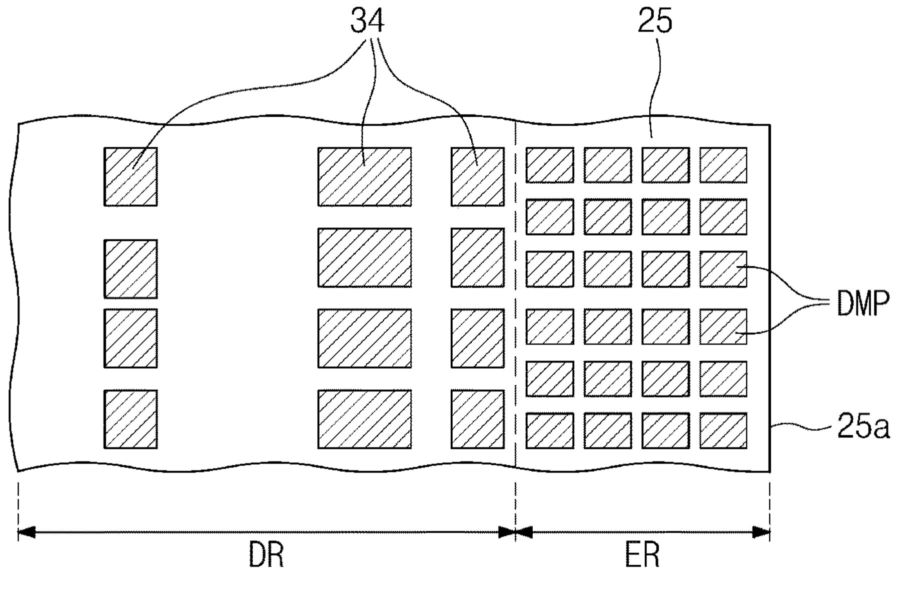
FIG. 4 is a plan view illustrating a semiconductor device according to an embodiment of the inventive concept, which corresponds to the sectional view of FIG. 3.

FIG. 3 is a sectional view illustrating a semiconductor device 2 according to an embodiment of the inventive concept. FIG. 4 is a plan view illustrating the semiconductor device 2 according to an embodiment of the inventive concept. Referring to FIGS. 3 and 4, the dummy pattern DMP may be provided on the edge region ER and in the device-interlayer insulating layer 25. The dummy pattern DMP may be disposed at a side of the second signal line pattern 34. The dummy pattern DMP may have a plurality of sub-patterns. The sub-patterns may be arranged in a first direction and a second direction, which are parallel to the first semiconductor substrate 10. In other words, the dummy pattern DMP may be dot patterns, which are arranged in the first and second directions. When viewed in a plan view, each of the sub-patterns may have a rectangular shape, as shown in FIG. 4. Alternatively, the planar shape of each of the sub-patterns may be changed to one of various shapes (e.g., circular, polygonal, or cross shapes). Here, the sub-patterns may have the same shape. For example, the sub-patterns may be substantially the same in distance, width, pitch, planar shape, and so forth. However, the inventive concept is not limited to this example, and in an embodiment, the sub-patterns may be provided to different distances, widths, pitches, and planar shapes, if necessary.

Unlike that shown in FIG. 4, the sub-patterns may be extended in a first direction parallel to the first semiconductor substrate 10 and may be arranged in a second direction, which is parallel to the first semiconductor substrate 10 and is not parallel to the first direction. In other words, the dummy pattern DMP may be a stripe pattern that is extended in the first direction. Here, the sub-patterns may have the same shape. For example, the sub-patterns may be the same in distance, width, and length. However, the inventive concept is not limited to this example, and in an embodiment, the sub-patterns may be provided to have at least two different distances, widths, and lengths, if necessary.

Alternatively, the dummy pattern DMP may include first sub-patterns and second sub-patterns, which are respectively extended in two different directions (e.g., the first and second directions) that are parallel to the first semiconductor substrate 10. The first sub-patterns and the second sub-patterns may be provided to cross each other. For example, the dummy pattern DMP may be a grid pattern, which is provided in the first and second directions.

According to an embodiment of the inventive concept, the dummy pattern DMP may include a plurality of sub-patterns. The dummy patterns DMP may be provided in the form of dot, line, or grid, and in this case, the dummy patterns DMP may be easily broken by an external stress and impact. This may make it possible to effectively absorb the stress and impact exerted on the semiconductor element. In other words, the external stress and impact may be consumed to break the dummy pattern DMP, and thus, it may be possible to prevent a crack issue in the semiconductor device. As a result, the semiconductor device 2 may be provided to have an improved structural stability.

Figure 5:
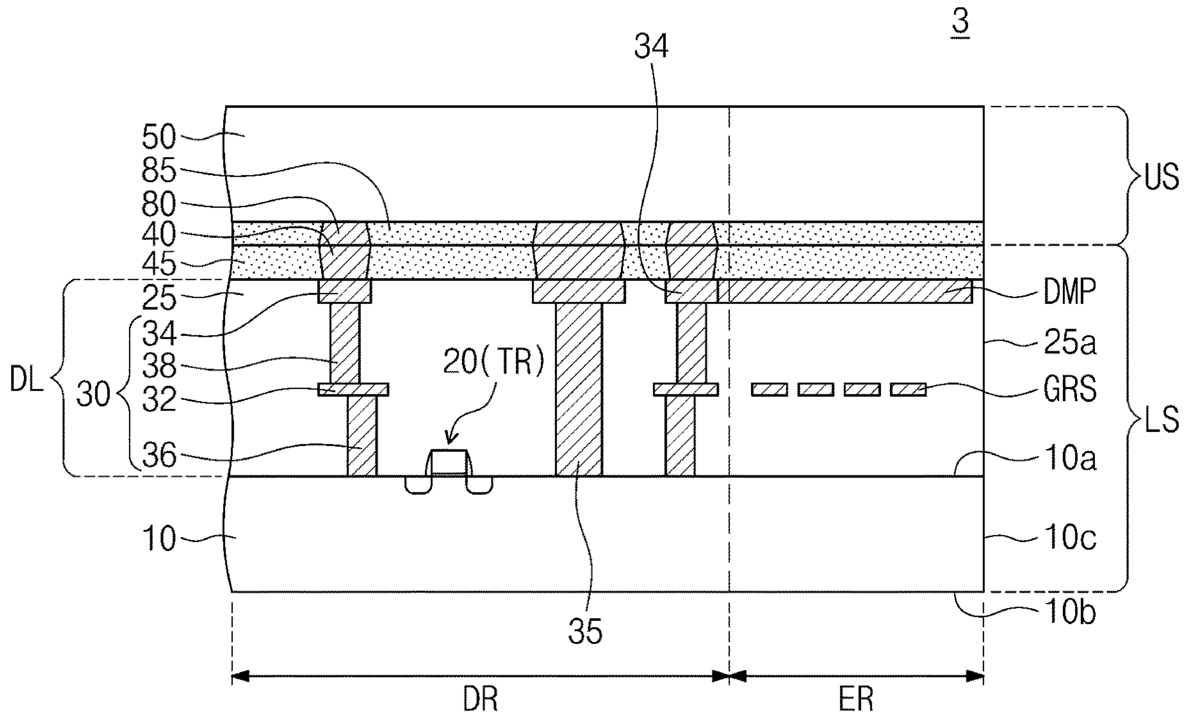
FIG. 5 is a sectional view illustrating a semiconductor device according to an embodiment of the inventive concept.
Figure 6:
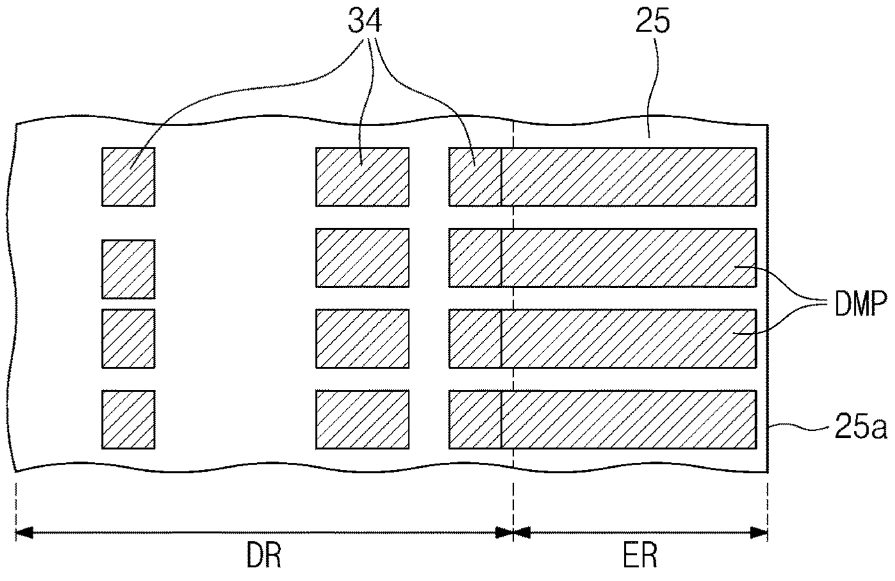
FIG. 6 is a plan view illustrating a semiconductor device according to an embodiment of the inventive concept, which corresponds to the sectional view of FIG. 5.

FIG. 5 is a sectional view illustrating a semiconductor device 3 according to an embodiment of the inventive concept. FIG. 6 is a plan view illustrating the semiconductor device 3 according to an embodiment of the inventive concept. Referring to FIGS. 5 and 6, the dummy pattern DMP may be provided on the edge region ER and in the device-interlayer insulating layer 25. The dummy pattern DMP may be disposed at a side of the second signal line pattern 34. In an embodiment, a plurality of the dummy patterns DMP may be provided, and here, each of the dummy patterns DMP may be located on one of side surfaces of the second signal line patterns 34.

Each of the dummy patterns DMP may be extended from the edge region ER to the device region DR. On the device region DR, the dummy pattern DMP may be connected to one of the second signal line patterns 34 adjacent thereto. The dummy patterns DMP and the second signal line patterns 34 may be provided as a single pattern or a single object without an interface therebetween. In an embodiment, the dummy patterns DMP and the second signal line patterns 34 may be provided as separate elements, between which an interface is present.

According to an embodiment of the inventive concept, the dummy pattern DMP may be used as a part of the second signal line pattern 34. The second signal line pattern 34 may be provided to have a large area and a low electric resistance. That is, the semiconductor device 3 with improved electric characteristics may be provided.

Figure 7:
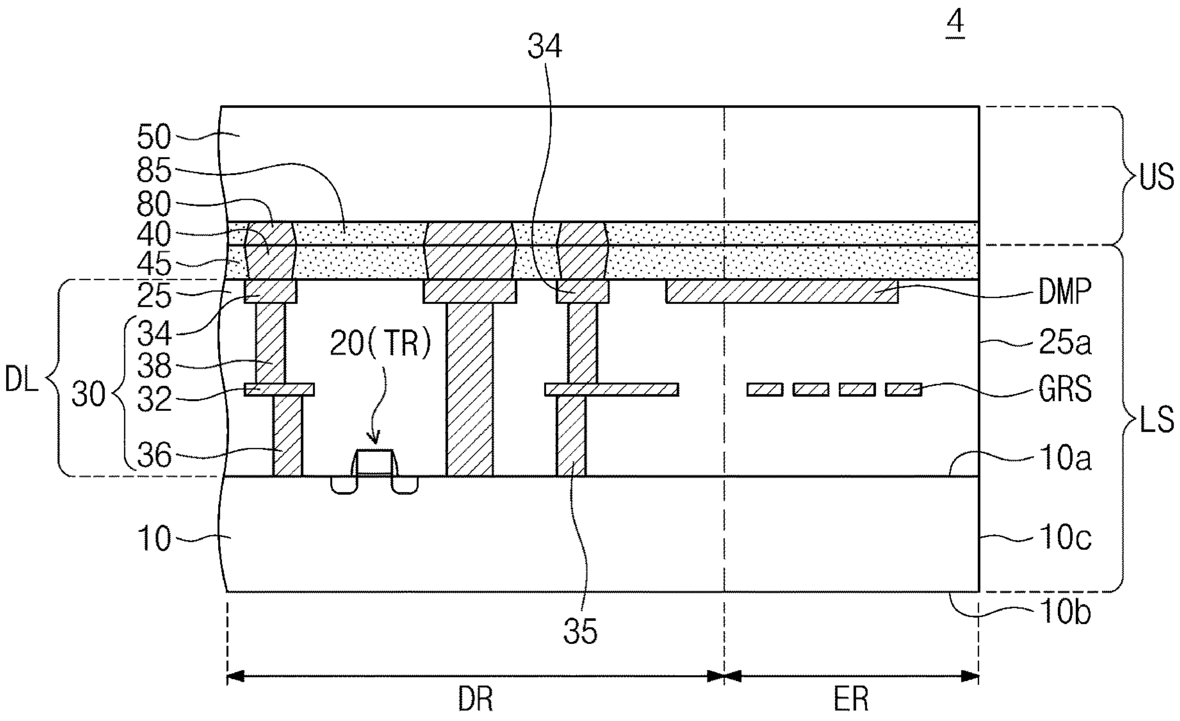
FIG. 7 is a sectional view illustrating a semiconductor device according to an embodiment of the inventive concept.
Figure 8:
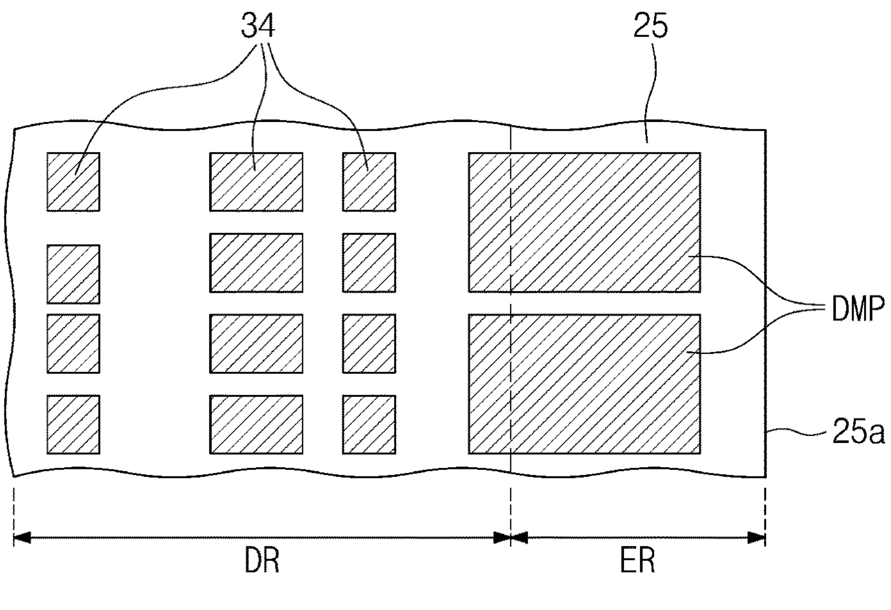
FIG. 8 is a plan view illustrating a semiconductor device according to an embodiment of the inventive concept, which corresponds to the sectional view of FIG. 7.

FIG. 7 is a sectional view illustrating a semiconductor device 4 according to an embodiment of the inventive concept. FIG. 8 is a plan view illustrating the semiconductor device 4 according to an embodiment of the inventive concept. Referring to FIGS. 7 and 8, the dummy pattern DMP may be provided on the edge region ER and in the device-interlayer insulating layer 25. The dummy pattern DMP may be disposed at a side of the second signal line pattern 34. In an embodiment, a plurality of the dummy patterns DMP may be provided, and here, each of the dummy patterns DMP may be placed on one of side surfaces of the second signal line patterns 34. The dummy pattern DMP may have a plate shape.

Each of the dummy patterns DMP may be extended from the edge region ER to the device region DR. Unlike the semiconductor device 3 in the embodiment of FIGS. 5 and 6, the dummy pattern DMP of the semiconductor device 4 may not be connected to the second signal line pattern 34. On the device region DR, some of the dummy patterns DMP may be extended toward the second signal line patterns 34 but may be horizontally spaced apart from the second signal line patterns 34.

Figure 9:
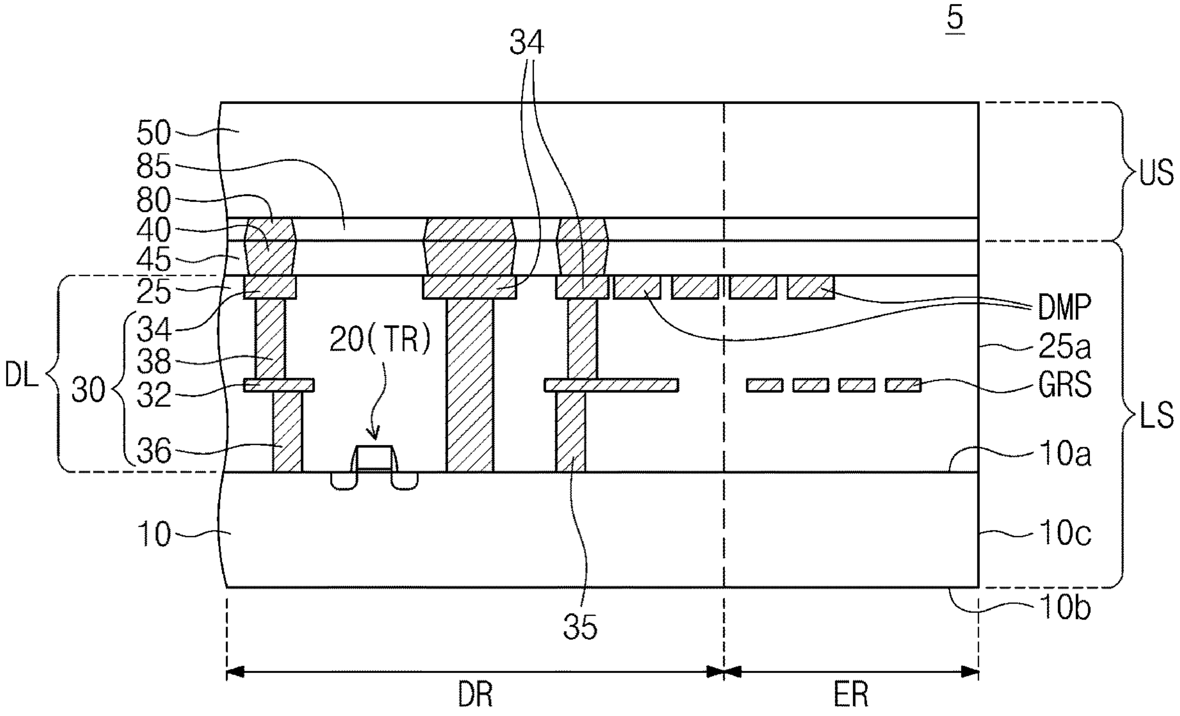
FIG. 9 is a sectional view illustrating a semiconductor device according to an embodiment of the inventive concept.
Figure 10:
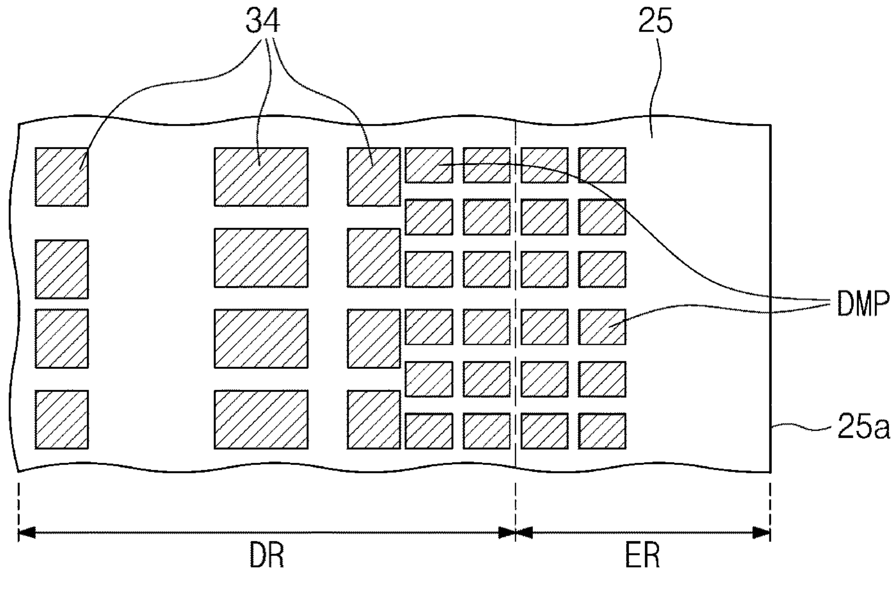
FIG. 10 is a plan view illustrating a semiconductor device according to an embodiment of the inventive concept, which corresponds to the sectional view of FIG. 10.

FIG. 9 is a sectional view illustrating a semiconductor device 5 according to an embodiment of the inventive concept. FIG. 10 is a plan view illustrating the semiconductor device 5 according to an embodiment of the inventive concept. Referring to FIGS. 9 and 10, the dummy pattern DMP may be provided on the edge region ER and in the device-interlayer insulating layer 25. The dummy pattern DMP may be disposed at a side of the second signal line pattern 34. In an embodiment, a plurality of the dummy patterns DMP may be provided, and here, each of the dummy patterns DMP may be located on one of side surfaces of the second signal line patterns 34.

The dummy pattern DMP may have a plurality of sub-patterns. The sub-patterns may be placed on the edge region ER. Here, some of the sub-patterns may be placed on the device region DR. That is, the sub-patterns may be provided on the edge region ER and a portion of the device region DR, which is adjacent to the edge region ER. The sub-patterns may be arranged in a first direction and a second direction, which are parallel to the first semiconductor substrate 10. In other words, the dummy pattern DMP may be dot patterns, which are arranged in the first and second directions. Alternatively, the dummy pattern DMP may be a stripe pattern, which is extended in a specific direction, or a grid pattern, which is extended in the first and second directions.

Figure 11:
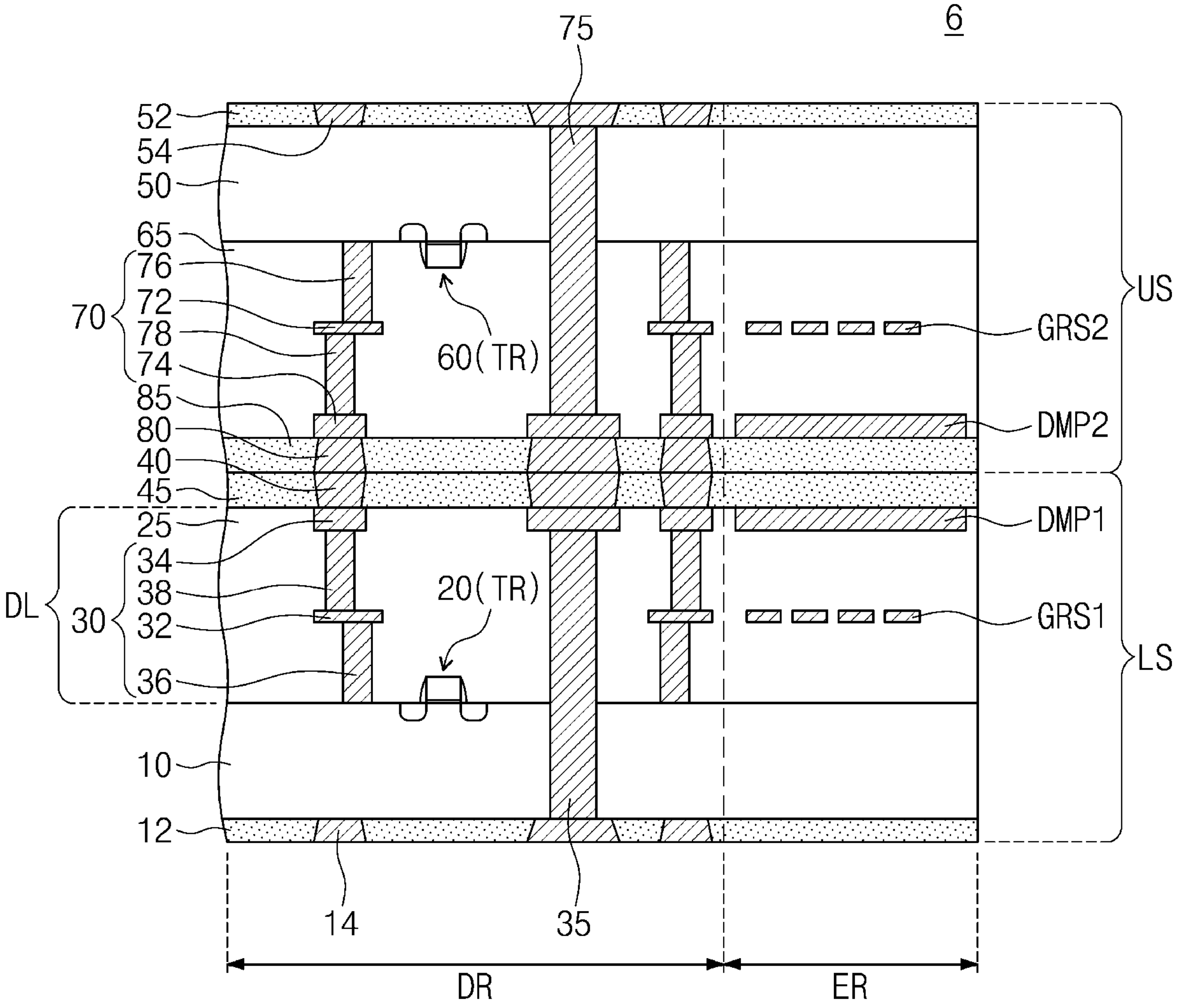
FIGS. 11 and 12 are sectional views illustrating a semiconductor device according to an embodiment of the inventive concept.

FIG. 11 is a sectional view illustrating a semiconductor device 6 according to an embodiment of the inventive concept. Referring to FIG. 11, the lower structure LS may be provided. The lower structure LS may be substantially the same as or similar to that described with reference to FIGS. 1 to 10. For example, the lower structure LS may include the first semiconductor substrate 10 and a circuit structure disposed on the first semiconductor substrate 10. The first semiconductor substrate 10 may have the device region DR and the edge region ER. The circuit structure may be disposed on the first semiconductor substrate 10. The circuit structure may include the first semiconductor element 20, the first device interconnection structure 30, and the first protection layer 45, which are provided on the front surface of the first semiconductor substrate 10. The first semiconductor element 20 may include the transistors TR, which are provided in the device region DR and on the front surface of the first semiconductor substrate 10. The first device-interlayer insulating layer 25 may be provided on the device region DR to veil or cover the first semiconductor element 20. The first device interconnection structure 30, which is connected to the first semiconductor element 20, may be provided on the device region DR and in the first device-interlayer insulating layer 25. The first device interconnection structure 30 may include the first signal line patterns 32, which are buried in the first device-interlayer insulating layer 25, and the second signal line patterns 34, which are provided on the first signal line patterns 32. The first device interconnection structure 30 may further include the first connection contacts 36, which are provided to connect the first signal line patterns 32 to the semiconductor element 20 or to the first semiconductor substrate 10, and the second connection contacts 38, which are provided to connect the first signal line patterns 32 to the second signal line patterns 34. The first device interconnection structure 30 may further include the first penetration electrode 35, which is provided to connect the first semiconductor substrate 10 to the second signal line patterns 34. A first guard ring structure GRS1 may be provided on the edge region ER and in the first device-interlayer insulating layer 25. A first dummy pattern DMP1 may be provided on the edge region ER and in the first device-interlayer insulating layer 25. The first dummy pattern DMP1 may be disposed at a side of the second signal line patterns 34. The first pads 40 may be disposed on the first device-interlayer insulating layer 25. The first protection layer 45 may be disposed on the first device-interlayer insulating layer 25 to enclose the first pads 40.

Furthermore, the rear surface of the first semiconductor substrate 10 of the lower structure LS may be covered with a first rear protection layer 12. The first rear protection layer 12 may be formed of or include at least one of, for example, silicon oxide (SiO), silicon nitride (SiN), or silicon carbonitride (SiCN). The first rear protection layer 12 may have a single- or multi-layered structure.

The first penetration electrode 35 may be provided to penetrate the first device-interlayer insulating layer 25, the first semiconductor substrate 10, and the first rear protection layer 12 in the device region DR. The first penetration electrode 35 may be in contact with a portion of the second signal line pattern 34. The first penetration electrode 35 may be formed of or include at least one of metallic materials (e.g., tungsten (W) or copper (Cu)). A penetration insulating layer may be interposed between the first penetration electrode 35 and the first semiconductor substrate 10. The penetration insulating layer may be formed of or include silicon oxide (SiO).

First rear pads 14 may be disposed in the first rear protection layer 12. The first rear pads 14 may be in contact with the first penetration electrode 35, on a bottom surface of the first rear protection layer 12. The first rear pads 14 may be formed of or include at least one of metallic materials (e.g., copper (Cu), gold (Au), nickel (Ni), or aluminum (Al)).

The upper structure US may be provided on the lower structure LS. The upper structure US may have substantially the same or similar structure as the lower structure LS. For example, the upper structure US may include the second semiconductor substrate 50 and a circuit structure, which is disposed on the second semiconductor substrate 50. The circuit structure may include a second semiconductor element 60, a second device interconnection structure 70, and the second protection layer 85, which are provided on the front surface of the second semiconductor substrate 50. The second semiconductor element 60 may include the transistors TR, which are provided in the device region DR of the second semiconductor substrate 50 and on the front surface of the second semiconductor substrate 50. The second semiconductor element 60 may be buried on a second device-interlayer insulating layer 65, which is provided on the device region DR. The second device interconnection structure 70, which is connected to the second semiconductor element 60, may be provided on the device region DR and in the second device-interlayer insulating layer 65. The second device interconnection structure 70 may include third signal line patterns 72, which are buried in the second device-interlayer insulating layer 65, and fourth signal line patterns 74, which are provided on the third signal line patterns 72. The second device interconnection structure 70 may further include third connection contacts 76, which are provided to connect the third signal line patterns 72 to the second semiconductor element 60 or to connect the third signal line patterns 72 to the second semiconductor substrate 50, and fourth connection contacts 78, which are provided to connect the third signal line patterns 72 to the fourth signal line patterns 74. The second device interconnection structure 70 may further include a second penetration electrode 75 connecting the second semiconductor substrate 50 to the fourth signal line patterns 74. A second guard ring structure GRS2 may be provided on the edge region ER and in the second device-interlayer insulating layer 65. A second dummy pattern DMP2 may be provided on the edge region ER and in the second device-interlayer insulating layer 65. The second dummy pattern DMP2 may be disposed at a side of the fourth signal line patterns 74. The second pads 80 may be disposed on the second device-interlayer insulating layer 65. The second protection layer 85 may be disposed on the second device-interlayer insulating layer 65 to enclose the second pads 80. A rear surface of the second semiconductor substrate 50 may be covered with a second rear protection layer 52. The second penetration electrode 75 may be provided in the device region DR to penetrate the second device-interlayer insulating layer 65, the second semiconductor substrate 50, and the second rear protection layer 52. Second rear pads 54 may be disposed in the second rear protection layer 52. On a top surface of the second rear protection layer 52, the second rear pads 54 may be in contact with the second penetration electrode 75.

The upper structure US may be disposed on the lower structure LS. The front surface of the first semiconductor substrate 10 of the lower structure LS may face the front surface of the second semiconductor substrate 50 of the upper structure US. Here, the first pads 40 of the lower structure LS may be vertically aligned to the second pads 80 of the upper structure US. The lower and upper structures LS and US may be in contact with each other.

At the interface between the lower and upper structures LS and US, the first protection layer 45 of the lower structure LS may be bonded to the second protection layer 85 of the upper structure US. At the interface between the lower and upper structures LS and US, the first pads 40 of the lower structure LS may be bonded to the second pads 80 of the upper structure US.

According to an embodiment of the inventive concept, since both of the lower and upper structures LS and US have the dummy patterns DMP1 and DMP2, which are used to reduce a variation in surface topology at an interface therebetween, the interface between the upper and lower structures US and LS may be flat, and thus, the upper and lower structures US and LS may be fully bonded to each other without any void therebetween. Thus, advantageously, the lower and upper structures LS and US may be strongly bonded to each other so that the structural stability of the semiconductor device 6 may be improved.

Figure 12:
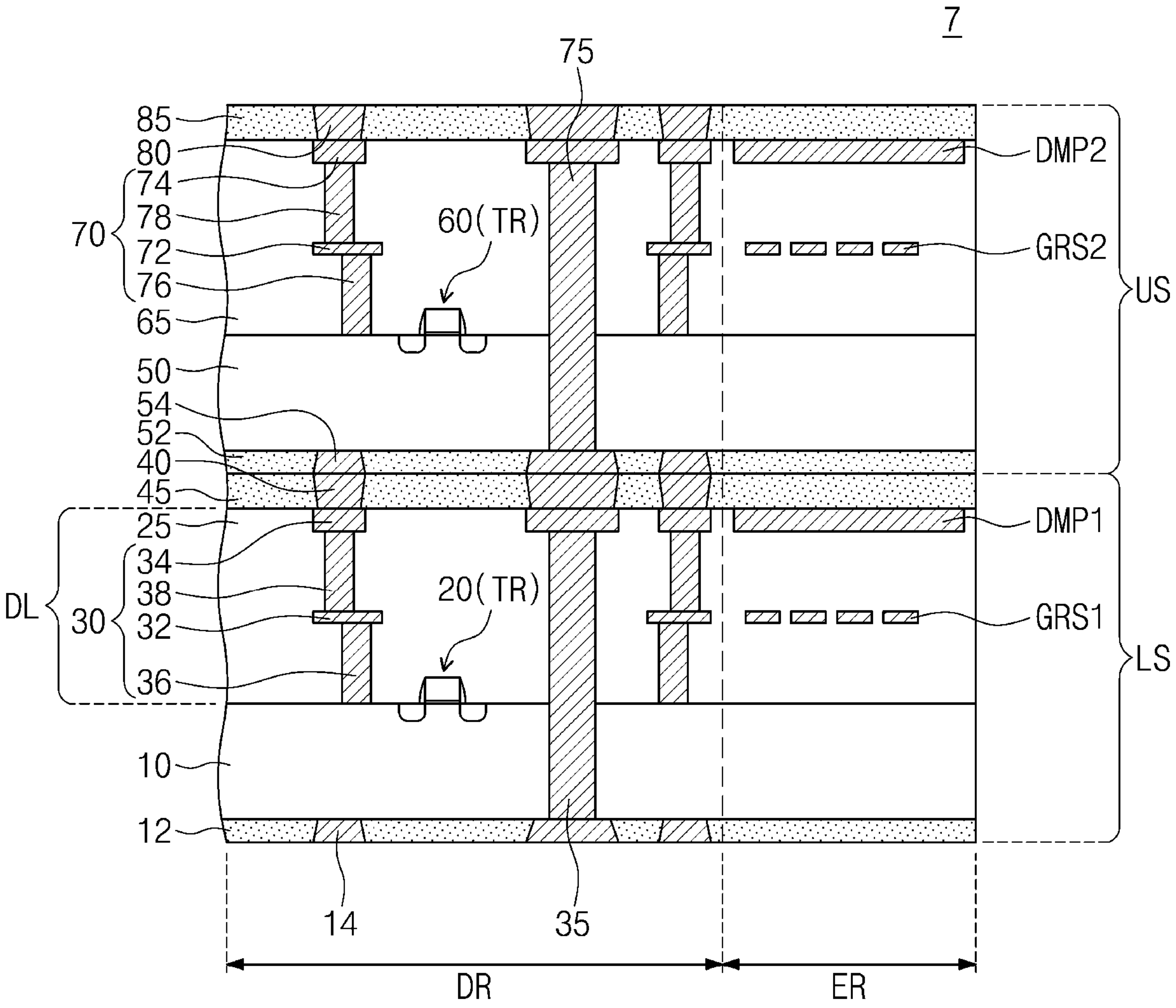

FIG. 12 is a sectional view illustrating a semiconductor device 7 according to an embodiment of the inventive concept. Referring to FIG. 12, the semiconductor device 7 may be provided to have a structure similar to the semiconductor device 6 described with reference to FIG. 11. However, the upper structure US of the semiconductor device 7 may be disposed such that the rear surface of the second semiconductor substrate 50 faces the front surface of the first semiconductor substrate 10.

The upper structure US may be disposed on the lower structure LS. The front surface of the first semiconductor substrate 10 of the lower structure LS may face the rear surface of the second semiconductor substrate 50 of the upper structure US. Accordingly, the first pads 40 of the lower structure LS and the second rear pads 54 of the upper structure US may be vertically aligned to each other. The lower and upper structures LS and US may be in contact with each other. At the interface between the lower and upper structures LS and US, the first protection layer 45 of the lower structure LS may be bonded to the second rear protection layer 52 of the upper structure US. At the interface between the lower and upper structures LS and US, the first pads 40 of the lower structure LS may be bonded to the second rear pads 54 of the upper structure US.

Figure 13:
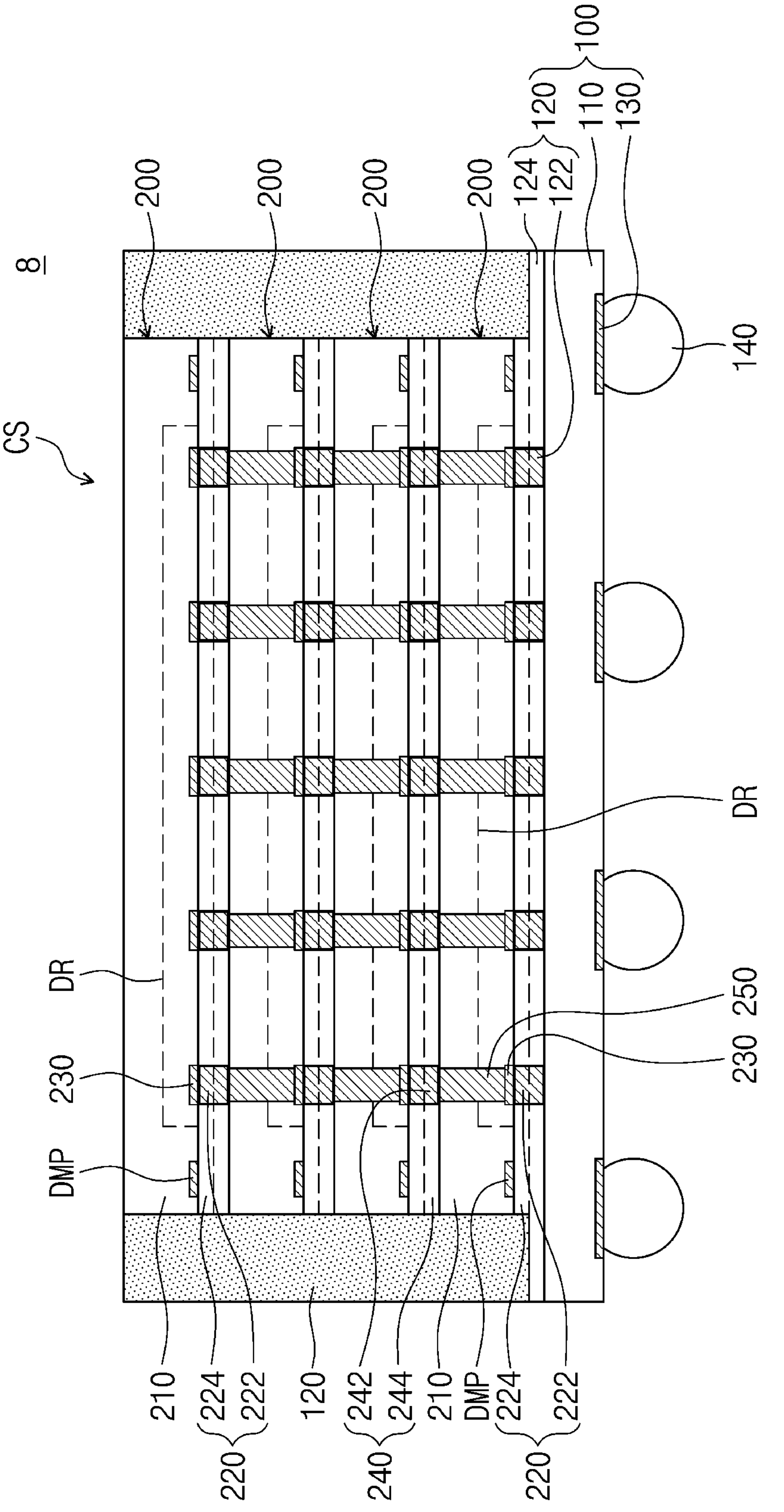
FIG. 13 is a sectional view illustrating a semiconductor device according to an embodiment of the inventive concept.

FIG. 13 is a sectional view illustrating a semiconductor device 8 according to an embodiment of the inventive concept. Referring to FIG. 13, a substrate 100 may be provided. The substrate 100 may be a substrate (e.g., a printed circuit board (PCB)), which is used to form a package, or an interposer substrate, which is provided in a package. Alternatively, the substrate 100 may be a semiconductor substrate, on which semiconductor elements are formed or integrated. The substrate 100 may include a substrate base layer 110 and a substrate interconnection layer 120 thereon.

The substrate interconnection layer 120 may include first substrate pads 122, which are exposed to the outside of the substrate base layer 110 near a top surface of the substrate base layer 110, and a substrate protection layer 124, which is provided to cover the substrate base layer 110 and to enclose the first substrate pads 122. In an embodiment, the first substrate pads 122 may have top surfaces that are coplanar with a top surface of the substrate protection layer 124.

Second substrate pads 130 may be provided near a bottom surface of the substrate base layer 110 and may be exposed to the outside of the substrate base layer 110. The substrate 100 may be configured to serve as a redistribution structure for a chip stack CS, which will be described below. For example, the first substrate pads 122 and the second substrate pads 130 may be electrically connected to each other by circuit interconnection patterns in the substrate base layer 110 and may form a redistribution circuit, along with the circuit interconnection patterns. The first substrate pads 122 and the second substrate pads 130 may be formed of or include at least one of conductive materials (e.g., metallic materials). For example, the first substrate pads 122 and the second substrate pads 130 may be formed of or include copper (Cu). The substrate protection layer 124 may be formed of or include at least one of insulating materials (e.g., oxide, nitride, or oxynitride materials), which include an element that is contained in the substrate base layer 110. For example, the substrate protection layer 124 may be formed of or include silicon oxide (SiO).

Substrate connection terminals 140 may be disposed on a bottom surface of the substrate 100. The substrate connection terminals 140 may be provided on the second substrate pads 130 of the substrate 100. The substrate connection terminals 140 may include solder balls, solder bumps, or the like. Depending on the kind and arrangement of the substrate connection terminals 140, the semiconductor device 8 may be provided in the form of ball grid array (BGA), fine ball grid array (FBGA), or land grid array (LGA).

A chip stack CS may be disposed on the substrate 100. The chip stack CS may include one or more semiconductor chips 200 and 200' stacked on the substrate 100. Each of the semiconductor chips 200 and 200' may be one of memory chips (e.g., DRAM, SRAM, MRAM, or FLASH memory chips). Alternatively, each of the semiconductor chips 200 and 200' may be a logic chip. FIG. 13 illustrates an example, in which on chip stack CS is provided, but the inventive concept is not limited to this example. In the case where a plurality of chip stacks are provided, the chip stacks may be spaced apart from each other on the substrate 100.

One semiconductor chip 200 may be mounted on the substrate 100. The semiconductor chip 200 may be formed of or include at least one of semiconductor materials (e.g., silicon (Si)). The semiconductor chip 200 may include a chip base layer 210, a first chip interconnection layer 220, which is disposed on the chip base layer 210 and near a front surface of the semiconductor chip 200, and a second chip interconnection layer 240, which is disposed on the chip base layer 210 and near a rear surface of the semiconductor chip 200. In the present specification, the front surface may be defined as an active surface of a semiconductor chip, on which integrated devices and pads are formed, and the rear surface may be defined as a surface that is opposite to the front surface.

The first chip interconnection layer 220 may include first chip pads 222, which are provided on the chip base layer 210, and a first chip protection layer 224, which is provided on the chip base layer 210 to enclose the first chip pads 222. The first chip pads 222 may correspond to the first pads 40 described with reference to FIGS. 1 to 12. For example, the chip base layer 210 may have the device region DR, on which transistors are formed, and may include a signal line pattern 230, which is connected to the transistor in the device region DR and is exposed to the outside of the chip base layer 210 near a bottom surface of the chip base layer 210. The first chip pads 222 may be connected to the signal line patterns 230, on the device region DR. The dummy patterns DMP may be provided in an edge region, which is located outside the device region DR, and in the chip base layer 210. The dummy patterns DMP may be exposed to the outside of the chip base layer 210 near the bottom surface of the chip base layer 210. The first chip protection layer 224 may be provided to cover the bottom surface of the chip base layer 210 and the bottom surfaces of the dummy patterns DMP and to enclose the first chip pads 222. The first chip pads 222 may be formed of or include at least one of conductive materials (e.g., metallic materials). For example, the first chip pads 222 may be formed of or include copper (Cu). The first chip protection layer 224 may be formed of or include at least one of insulating materials. For example, the first chip protection layer 224 may be formed of or include silicon oxide (SiO).

The second chip interconnection layer 240 may include second chip pads 242, which are provided on the chip base layer 210, and a second chip protection layer 244, which is provided on the chip base layer 210 to enclose the second chip pads 242. The second chip pads 242 may correspond to the first rear pads 14 described with reference to FIGS. 11 and 12. For example, the second chip pads 242 may have top surfaces that are coplanar with a top surface of the second chip protection layer 244. The second chip pads 242 may be electrically connected to the first chip interconnection layer 220. In an embodiment, the second chip pads 242 may be coupled to the signal line pattern 230 of the first chip interconnection layer 220 through penetration electrodes 250, which are formed to vertically penetrate the chip base layer 210. The second chip pads 242 may be formed of or include at least one of conductive materials (e.g., metallic materials). For example, the second chip pads 242 may be formed of or include copper (Cu). The second chip protection layer 244 may be formed of or include at least one of insulating materials. For example, the second chip protection layer 244 may be formed of or include silicon oxide (SiO).

The semiconductor chip 200 may be mounted on the substrate 100. As shown in FIG. 13, the semiconductor chip 200 may be provided such that a front surface thereof faces the substrate 100, and the semiconductor chip 200 may be electrically connected to the substrate 100. Here, the front surface of the semiconductor chip 200 (i.e., the bottom surface of the first chip interconnection layer 220) may be in contact with a top surface of the substrate 100. For example, the first chip protection layer 224 may be in contact with the substrate protection layer 124 of the substrate 100. The first chip pads 222 of the semiconductor chip 200 may be disposed to correspond to the first substrate pads 122 of the substrate 100. The first chip pads 222 of the semiconductor chip 200 may be bonded to the first substrate pads 122 of the substrate 100.

In an embodiment, a plurality of semiconductor chips 200 may be provided. For example, one of the semiconductor chips 200 (hereinafter, a first semiconductor chip) may be mounted on another of the semiconductor chips 200 (hereinafter, a second semiconductor chip). The first semiconductor chip may be disposed such that a front surface thereof faces the second semiconductor chip. Here, the front surface of the first semiconductor chip may be in contact with a rear surface of the second semiconductor chip. For example, the first chip interconnection layer 220 of the first semiconductor chip and the second chip interconnection layer 240 of the second semiconductor chip may be in contact with each other. In detail, the semiconductor chips 200 may be stacked such that the first chip protection layer 224 is in contact with the second chip protection layer 244.

The first chip pads 222 of the semiconductor chip 200 may be disposed to correspond to the second chip pads 242 of another semiconductor chip 200 placed thereon. The first and second chip pads 222 and 242 of two adjacent ones of the semiconductor chips 200 may be bonded to each other. The semiconductor chips 200 may be electrically connected to each other through the first and second chip pads 222 and 242. A plurality of semiconductor chips 200 and 200' may be stacked on the substrate 100 in the manner described above. The semiconductor chip 200', which is the uppermost one of the semiconductor chips 200 and 200' of the chip stack CS, may have a structure that is slightly different from the remaining ones of the semiconductor chips 200. As an example, the uppermost semiconductor chip 200' may not have the second chip interconnection layer 240 and the penetration electrodes 250.

A mold layer 300 may be provided on the substrate 100. The mold layer 300 may cover the top surface of the substrate 100. The mold layer 300 may be provided to enclose the chip stack CS. That is, the mold layer 300 may cover the side surfaces of the semiconductor chips 200. The mold layer 300 may protect the chip stack CS. The mold layer 300 may be formed of or include at least one of insulating materials. For example, the mold layer 300 may be formed of or include epoxy molding compound (EMC). In an embodiment, the mold layer 300 may be formed to cover the chip stack CS, unlike the illustrated structure. For example, the mold layer 300 may cover the rear surface of the uppermost semiconductor chip 200'.

Although the semiconductor chips 200 are illustrated to be mounted on the substrate 100, the inventive concept is not limited to this example. For example, the semiconductor chips 200 may be mounted on a base semiconductor chip. The base semiconductor chip may be a wafer-level semiconductor substrate that is formed of a semiconductor material (e.g., silicon). The base semiconductor chip may include an integrated circuit. For example, the integrated circuit may be a memory circuit, a logic circuit, or combinations thereof.

Figure 14:
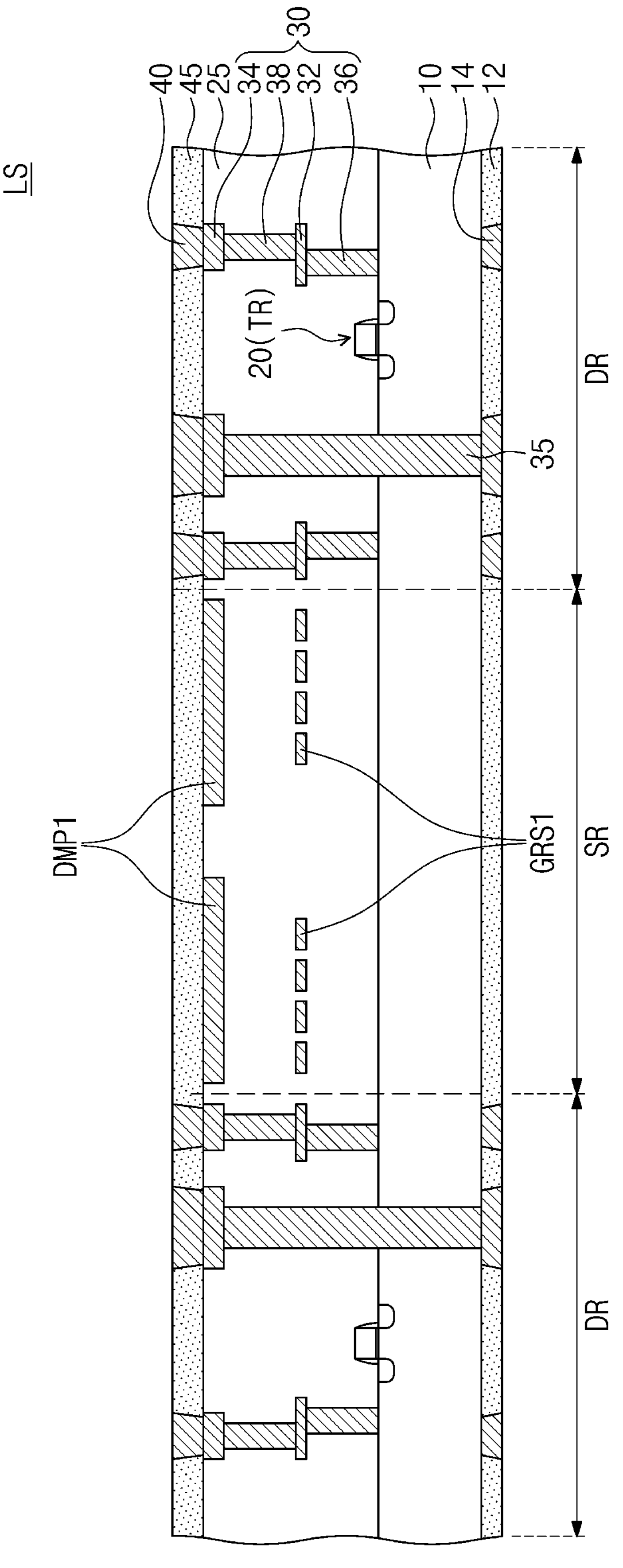
FIGS. 14, 15, 16, and 17 are sectional views illustrating a method of fabricating a semiconductor device according to an embodiment of the inventive concept.

FIGS. 14 to 17 are sectional views illustrating a method of fabricating a semiconductor device according to an embodiment of the inventive concept. Referring to FIG. 14, a wafer may be provided. The wafer may correspond to the first semiconductor substrate 10 of FIG. 14. A plurality of device regions DR may be arranged on the first semiconductor substrate 10. Each of the device regions DR may be referred to as a 'chip region'. A scribe lane region SR may be disposed between the device regions DR.

The first semiconductor elements 20 may be formed on the front surface of the first semiconductor substrate 10 by a conventional process. For example, source and drain regions may be formed in an upper portion of the first semiconductor substrate 10 and on the device regions DR, and then, the transistors TR may be formed by forming a gate insulating layer and a gate electrode between the source and drain regions. The first device-interlayer insulating layer 25 and the first device interconnection structure 30 may be formed on the first semiconductor substrate 10. For example, a lower portion of the first device-interlayer insulating layer 25 may be formed by deposing an insulating material on the front surface of the first semiconductor substrate 10. The first connection contacts 36 may be formed to penetrate the lower portion of the first device-interlayer insulating layer 25 and to be connected to the first semiconductor substrate 10, and the first signal line patterns 32 may be formed on the lower portion of the first device-interlayer insulating layer 25. In an embodiment, when the first signal line patterns 32 are formed, the first guard ring structures GRS1 may be formed on the scribe lane region SR. An upper portion of the first device-interlayer insulating layer 25 may be formed by depositing an insulating material on the lower portion of the first device-interlayer insulating layer 25. The second connection contacts 38 may be formed to penetrate the first device-interlayer insulating layer 25 and to be connected to the first signal line pattern 32, and then, the second signal line patterns 34 may be formed in an upper portion of the first device-interlayer insulating layer 25. In an embodiment, when the first signal line patterns 32 are formed, the first dummy patterns DMP1 may be formed on the scribe lane region SR. The first penetration electrode 35 may be formed to penetrate the upper and lower portions of the first device-interlayer insulating layer 25 and the first semiconductor substrate 10.

The first protection layer 45 may be formed on the first device-interlayer insulating layer 25. Here, the first pads 40 may be formed on the device regions DR, and the first protection layer 45 may be formed to enclose the first pads 40. The first rear protection layer 12 may be formed on the rear surface of the first semiconductor substrate 10. Here, the first rear pads 14 may be formed on the device regions DR, and the first rear protection layer 12 may be formed to enclose the first rear pads 14. As a result of the above process, the lower structure LS may be formed.

Figure 15:
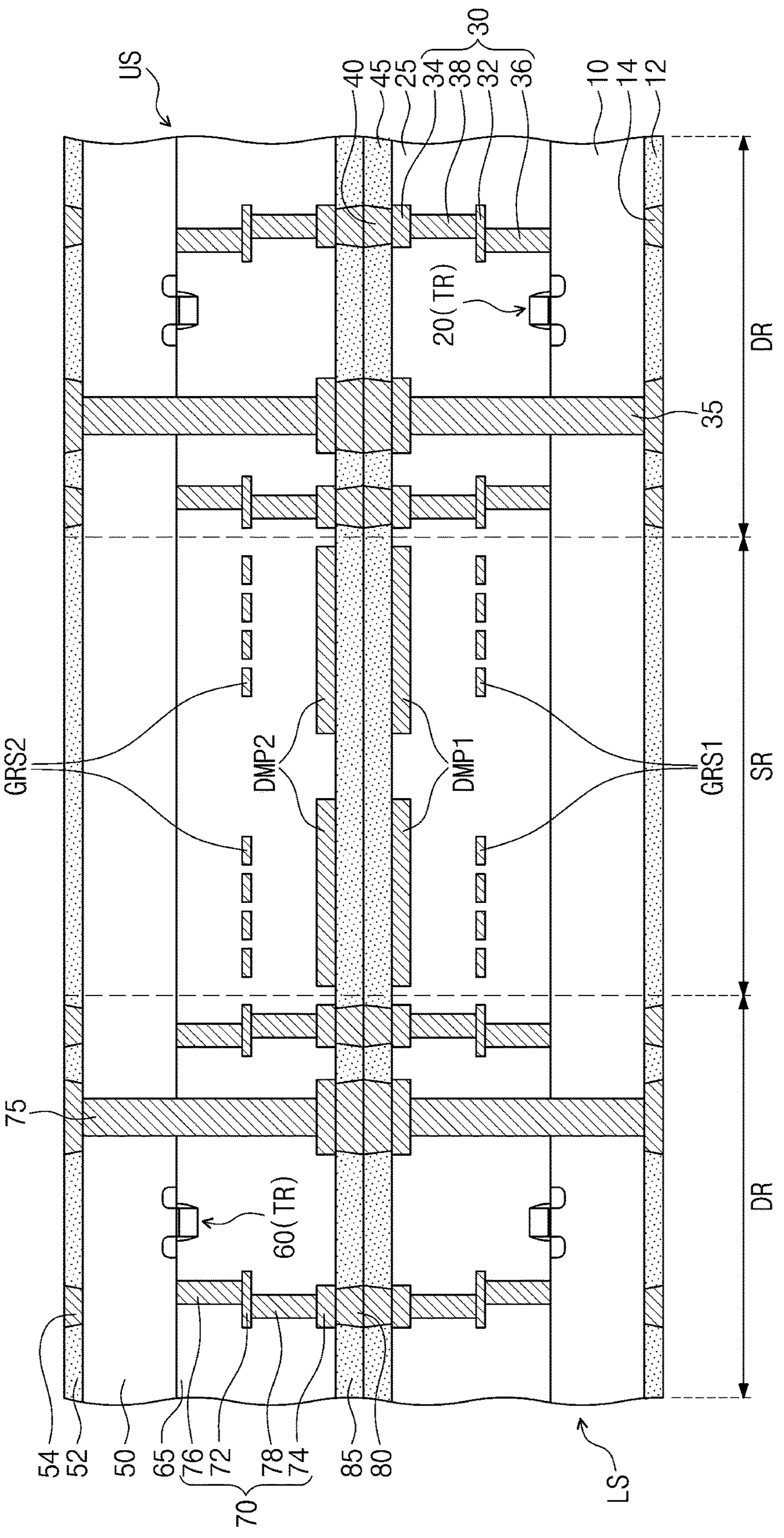

Referring to FIG. 15, the upper structure US may be formed. A process of forming the upper structure US may be substantially similar to a process of forming the lower structure LS. For example, the second semiconductor elements 60 may be formed on the second semiconductor substrate 50, which is provided as a wafer, the second device-interlayer insulating layer 65, the second device interconnection structure 70, the second guard ring structures GRS2, the second penetration electrode 75, and the second dummy patterns DMP2 may be formed on the second semiconductor substrate 50, the second protection layer 85 and the second pads 80 may be formed on the second device-interlayer insulating layer 65, and the second rear protection layer 52 and the second rear pads 54 may be formed on the rear surface of the second semiconductor substrate 50.

The upper structure US may be disposed on the lower structure LS. The front surface of the first semiconductor substrate 10 of the lower structure LS may face the front surface of the second semiconductor substrate 50 of the upper structure US. Here, the first pads 40 of the lower structure LS may be vertically aligned to the second pads 80 of the upper structure US. The top surface of the first protection layer 45 and the bottom surface of the second protection layer 85 may be in contact with each other, and the top surfaces of the first pads 40 and the bottom surfaces of the second pads 80 may be in contact with each other.

Figure 16:
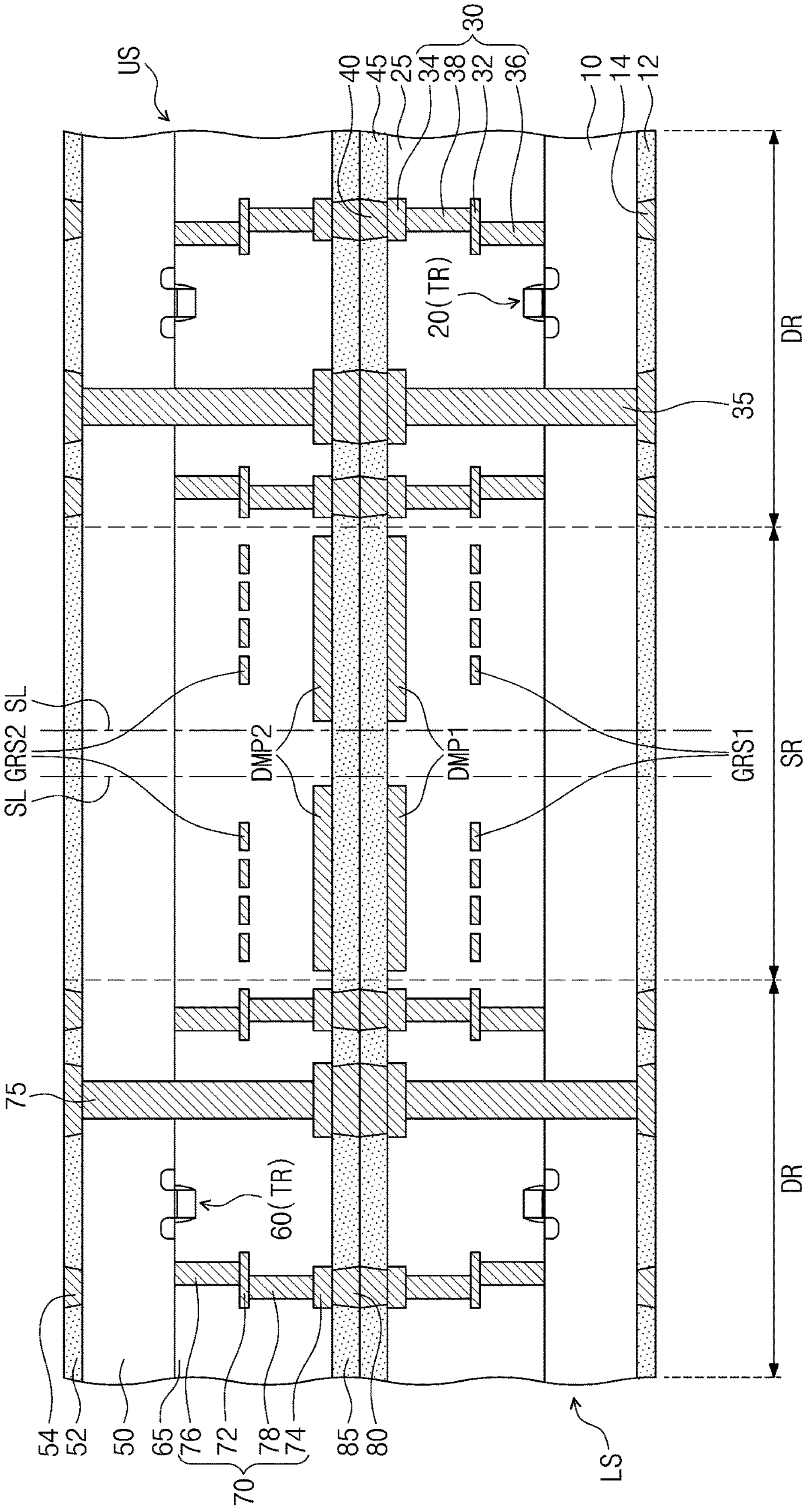

Referring to FIG. 16, the lower and upper structures LS and US may be bonded to each other. A thermal treatment process may be performed on the lower and upper structures LS and US. As a result of the thermal treatment process, the first pads 40 may be bonded to the second pads 80. For example, the first pads 40 and the second pads 80 may be bonded to form a single object. The bonding of the first and second pads 40 and 80 may be executed in an enhanced manner. For example, the first and second pads 40 and 80 may be formed of the same material (e.g., copper (Cu)), and in this case, the first and second pads 40 and 80 may be bonded to each other by an intermetal hybrid bonding process, which is caused by a surface activation at an interface between the first and second pads 40 and 80 in contact with each other. The first protection layer 45 and the second pads 80 may be bonded to each other by the thermal treatment process.

Due to a difference in thermal expansion coefficients between patterns or elements in the lower and upper structures LS and US in the thermal treatment process, a stress may occur in the lower and upper structures LS and US. According to an embodiment of the inventive concept, since both of the lower and upper structures LS and US include the dummy patterns DMP1 and DMP2 that are placed near an interface therebetween and are formed of a metallic material, a warpage issue may not occur at the upper and lower structures US and LS on the scribe lane region SR. Accordingly, the interface between the upper and lower structures US and LS may be flat, and the upper and lower structures US and LS may be fully bonded to each other without any void therebetween. That is, the lower and upper structures LS and US may be strongly bonded to each other, and thus, the structural stability of the semiconductor device may be improved.

Figure 17:
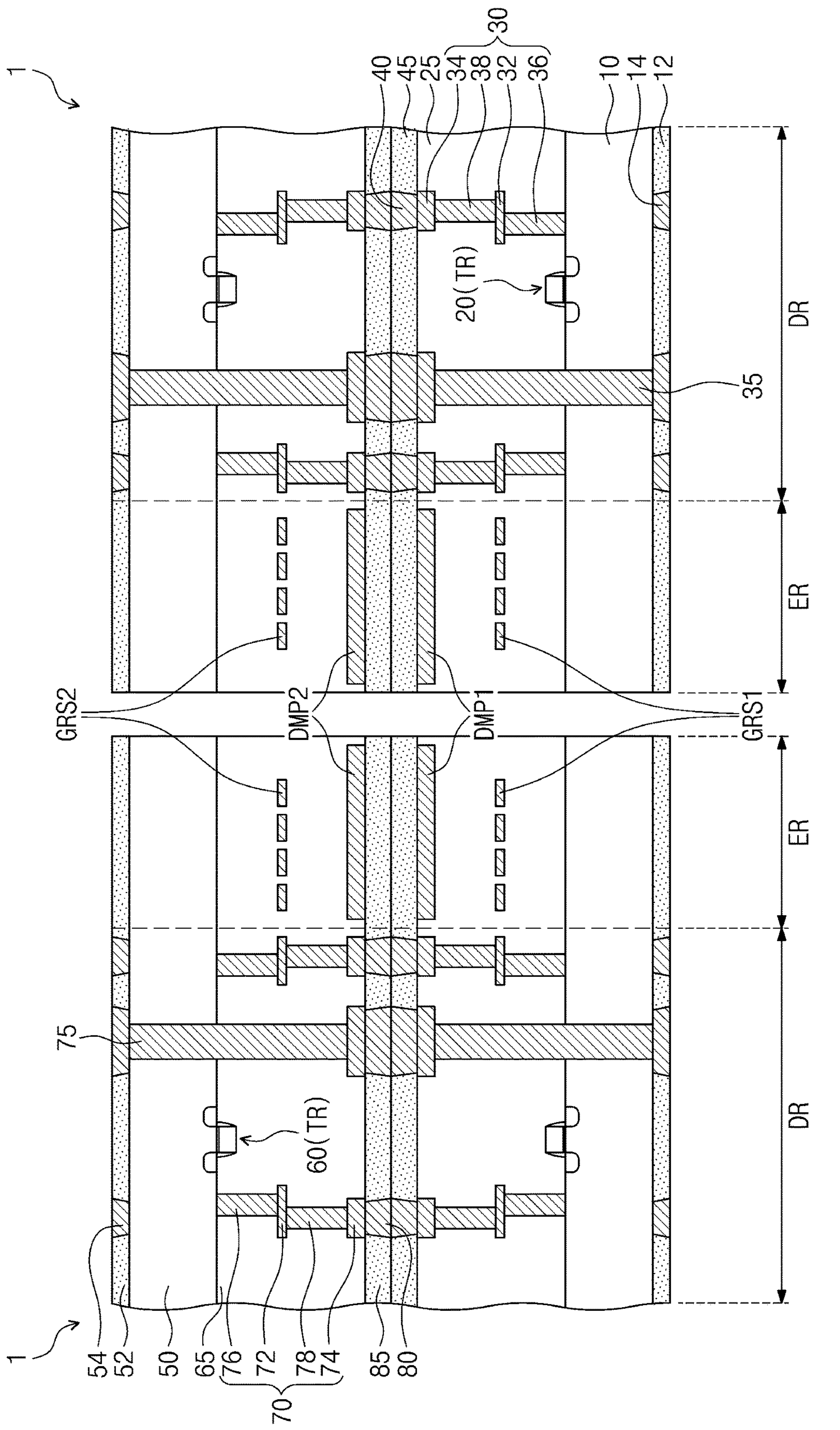

Referring to FIG. 17, a sawing process using a laser beam may be performed to remove a portion of the scribe lane region SR and to separate semiconductor devices 1 from each other. In more detail, the laser beam may be irradiated along the cutting line SL to remove the first semiconductor substrate 10, the first device-interlayer insulating layer 25, the first protection layer 45, the second protection layer 85, the second device-interlayer insulating layer 65, and the second semiconductor substrate 50, which are located on the portion of the scribe lane region SR. The cutting line SL may be set on the scribe lane region SR. The cutting line SL may be provided between the device regions DR and may be extended in a direction. The cutting line SL may be located at a center of the scribe lane region SR. For example, distances from the device regions DR to the cutting line SL may have substantially the same or similar value. After the sawing process, a remaining portion of the scribe lane region SR, except for the removed portion, may be left as the edge region ER of the semiconductor device 1.

Figure 18:
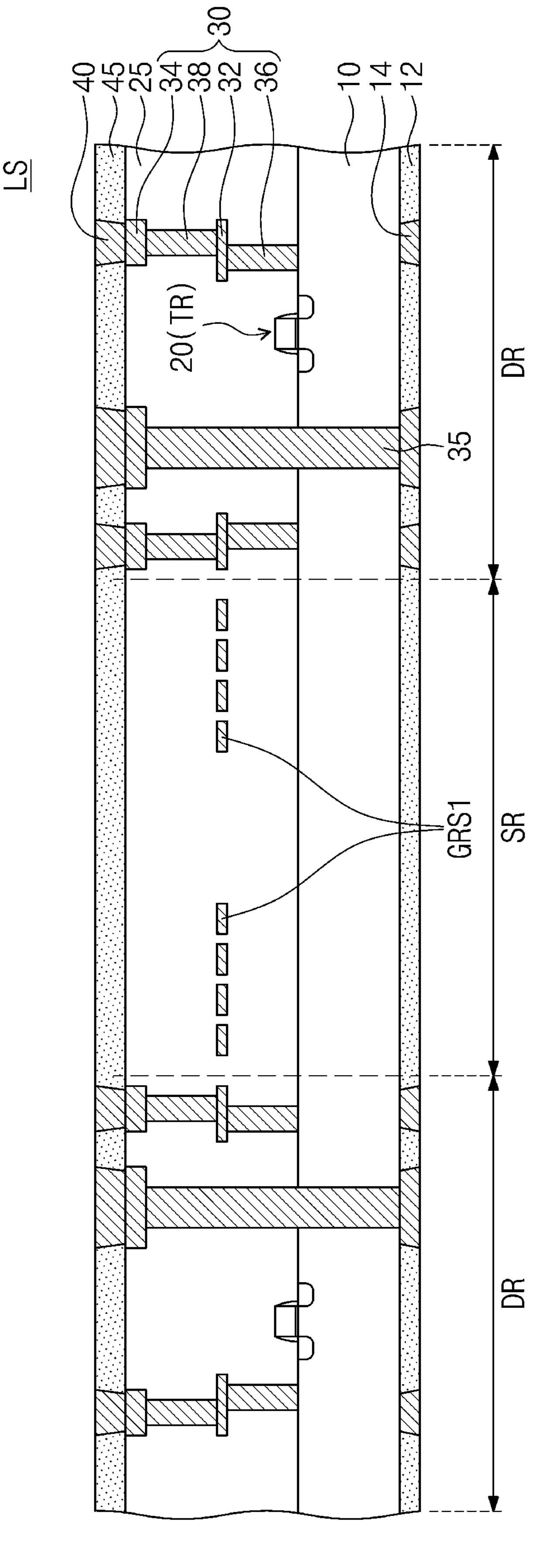
FIGS. 18, 19, 20, and 21 are sectional views illustrating a method of fabricating a semiconductor device.
Figure 19:
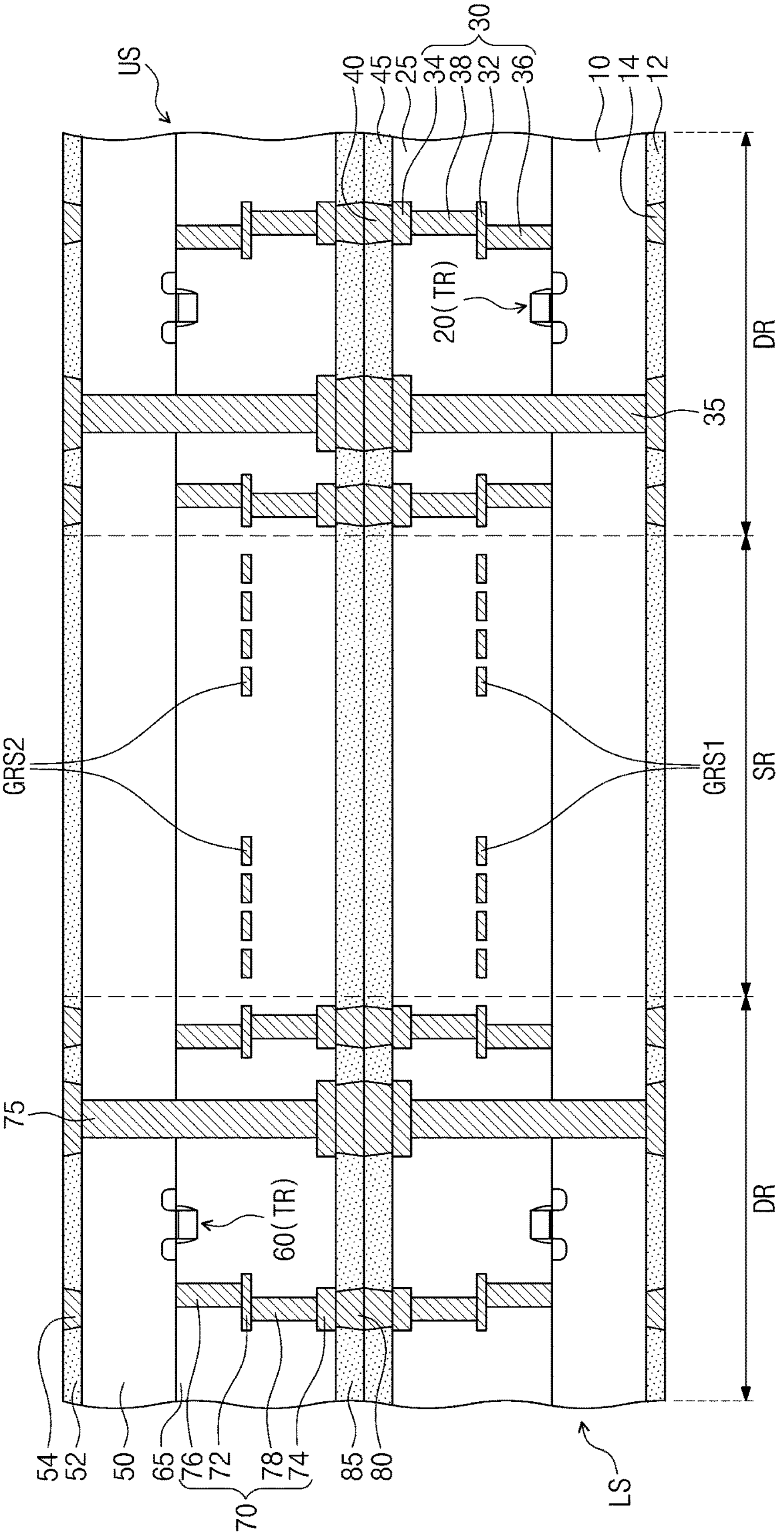

FIGS. 18 to 21 are sectional views illustrating a method of fabricating a semiconductor device. Referring to FIG. 18, the lower structure LS may be formed. In the lower structure LS of FIG. 18, the first dummy patterns DMP1 may not be formed on the scribe lane region SR. Referring to FIG. 19, the upper structure US may be formed. In the upper structure US of FIG. 19, the second dummy patterns DMP2 may not be formed on the scribe lane region SR.

The upper structure US may be disposed on the lower structure LS. The front surface of the first semiconductor substrate 10 of the lower structure LS may face the front surface of the second semiconductor substrate 50 of the upper structure US. Here, the first pads 40 of the lower structure LS may be vertically aligned to the second pads 80 of the upper structure US. The top surface of the first protection layer 45 and the bottom surface of the second protection layer 85 may be in contact with each other, and the top surfaces of the first pads 40 and the bottom surfaces of the second pads 80 may be in contact with each other.

Figure 20:
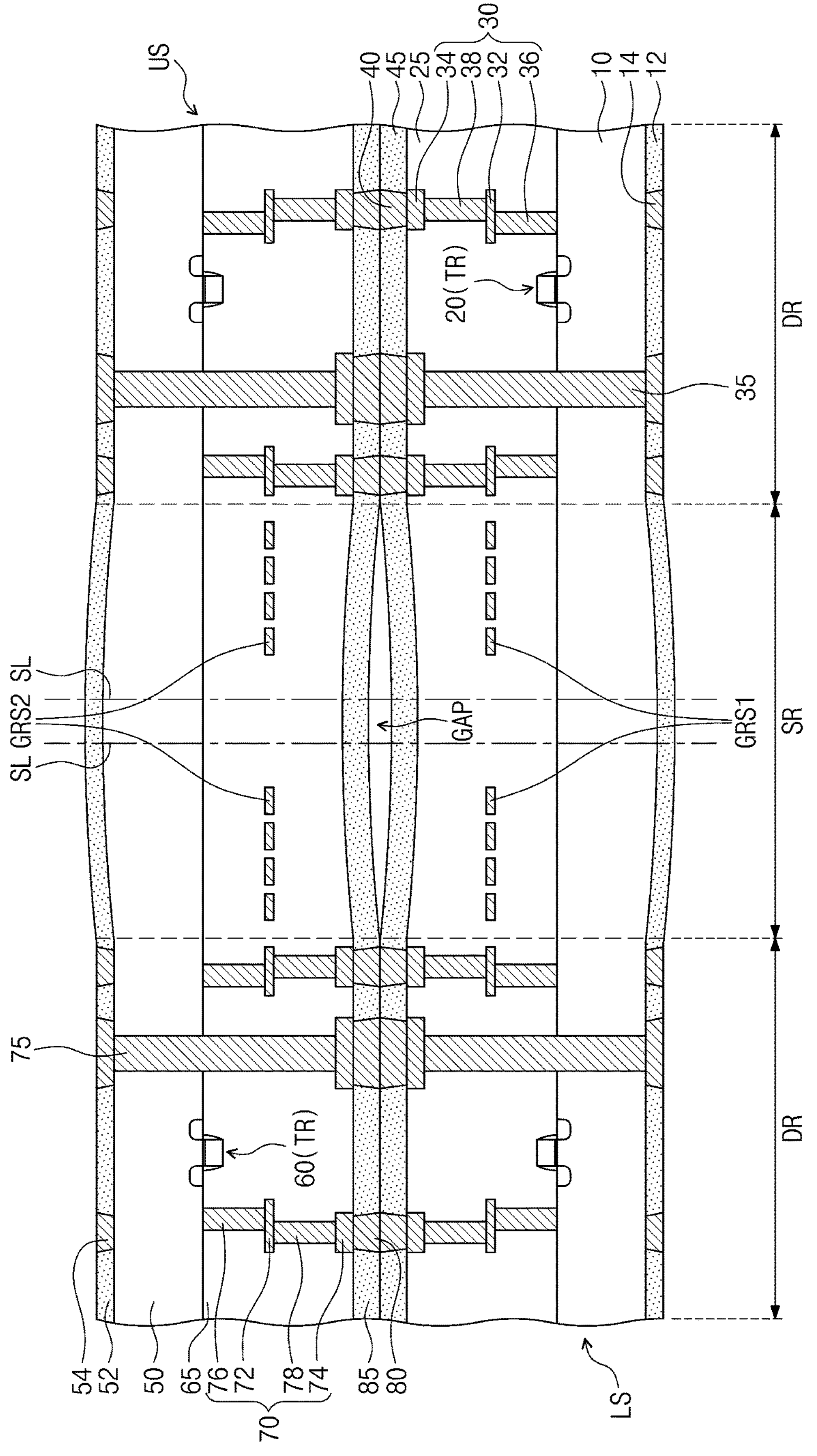

Referring to FIG. 20, the lower and upper structures LS and US may be bonded to each other. A thermal treatment process may be performed on the lower and upper structures LS and US. As a result of the thermal treatment process, the first pads 40 may be bonded to the second pads 80. The first protection layer 45 and the second pads 80 may be bonded to each other by the thermal treatment process. Due to a difference in thermal expansion coefficients between patterns or elements in the lower and upper structures LS and US in the thermal treatment process, a stress may occur in the lower and upper structures LS and US. In the case where, as shown in FIG. 20, the dummy patterns DMP1 and DMP2 are not provided in the upper and lower structures US and LS on the scribe lane region SR, the upper and lower structures US and LS on the scribe lane region SR may be partially deformed. For example, a warpage issue may occur at the upper and lower structures US and LS located on the scribe lane region SR. Accordingly, the upper and lower structures US and LS may be spaced apart from each other in the scribe lane region SR, and a gap GAP may occur between the upper and lower structures US and LS.

Figure 21:
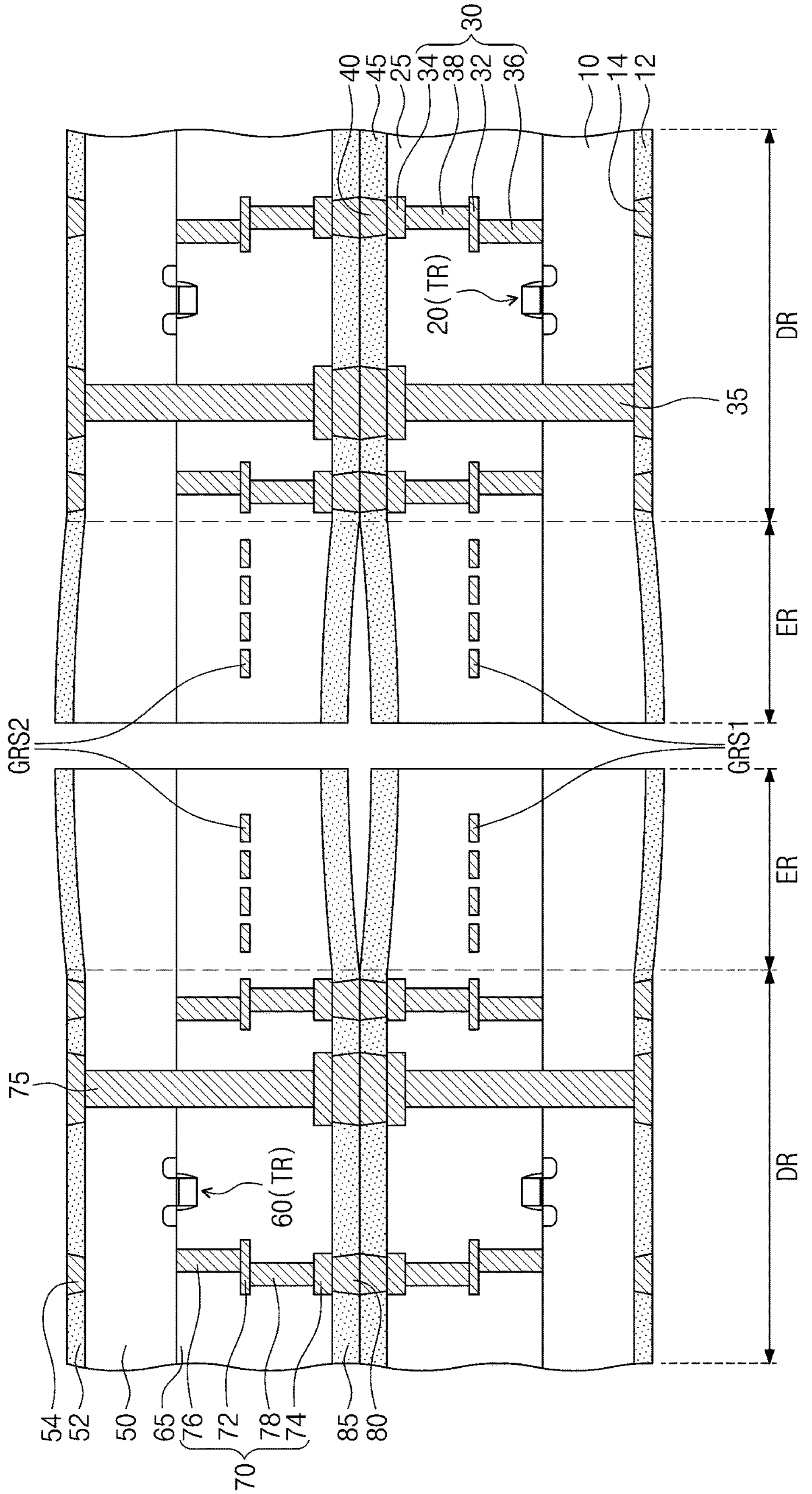

Referring to FIG. 21, a sawing process using a laser beam may be performed to remove a portion of the scribe lane region SR and to form semiconductor devices, which are separated from each other. In more detail, the laser beam may be irradiated along the cutting line SL to remove the first semiconductor substrate 10, the first device-interlayer insulating layer 25, the first protection layer 45, the second protection layer 85, the second device-interlayer insulating layer 65, and the second semiconductor substrate 50, which are located on the portion of the scribe lane region SR. After the sawing process, a remaining portion of the scribe lane region SR, except for the removed portion, may be left as the edge regions ER of the semiconductor devices.

In the case where, as shown in FIGS. 20 and 21, the gap GAP is formed between the upper and lower structures US and LS in the scribe lane region SR, the upper and lower structures US and LS of a fabricated semiconductor device may be spaced apart from each other in the edge region ER. A separation between the upper and lower structures US and LS may cause a delamination defect between the upper and lower structures US and LS.

According to an embodiment of the inventive concept, since the dummy patterns DMP1 and DMP2 are provided in the upper and lower structures US and LS such that the upper and lower structures US and LS are not spaced apart from each other in the scribe lane region SR, it may be possible to remove a defect from a fabricated semiconductor device and to improve structural stability of the semiconductor device.

According to an embodiment of the inventive concept, a semiconductor device may include dummy patterns provided on an edge region of a semiconductor substrate. In the case where an impact or stress is exerted on a semiconductor element in a lateral direction, the dummy patterns may be used as a partition wall relieving the impact or stress, and thus, the semiconductor element may be protected from the impact or stress. In addition, the dummy patterns may prevent deformation (e.g., bending) of a lower structure, and as a result, the lower structure may have a substantially flat top surface. Accordingly, when the lower structure is bonded to an upper structure, it may be possible to reduce a separation between the lower structure and the upper structure caused by a surface topology of the lower structure. Thus, the lower structure and the upper structure may be fully bonded to each other without any void therebetween. That is, the lower structure and the upper structure may be robustly bonded to each other, and this may make it possible to improve structural stability of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
- a substrate;
- a lower die on the substrate, said lower die comprising:
  - a first semiconductor substrate having a first device region and a first edge region therein;
  - a first semiconductor element on the first device region;
  - a first pad on the first device region and on the first semiconductor element; and
  - a first interconnection structure connecting the first semiconductor element to the first pad, said first interconnection structure comprising a first signal pattern on the first device region and connected to the first semiconductor element, a second signal pattern on the first device region and directly connected to the first pad, and a first dummy pattern extending at the same level as the second signal pattern and extending on the first edge region; and
- an upper die bonded to the lower die such that the first pad of the lower die is in contact with a second pad of the upper die.

2. The device of claim 1, wherein the first dummy pattern extends to a region on the first device region and is connected to the second signal pattern.

3. The device of claim 1, wherein the first dummy pattern and the second signal pattern are spaced apart from each other; and wherein the first dummy pattern floats electrically relative to the first semiconductor element.

4. The device of claim 3, wherein the first dummy pattern:
- (a) has a plate shape; or
- (b) includes a plurality of spaced-apart sub-patterns.

5. The device of claim 1, wherein the first signal pattern and the second signal pattern are not provided on the first edge region.

6. The device of claim 1, wherein the second signal pattern and the first dummy pattern have the same thickness; and wherein a thickness of the second signal pattern and a thickness of the first dummy pattern range from 1 μm to 10 μm.

7. The device of claim 1, further comprising:
- a first interlayer insulating layer, which extends on the first semiconductor substrate and covers the first semiconductor element; and
- a first protection layer, which is provided on the first interlayer insulating layer and exposes a top surface of the first pad; and
- wherein the first interconnection structure extends on the first interlayer insulating layer.

8. The device of claim 7, wherein a top surface of the second signal pattern and a top surface of the first dummy pattern are coplanar with a top surface of the first interlayer insulating layer.

9. The device of claim 1, further comprising a guard ring structure, which is provided on the first edge region of the first semiconductor substrate, is located below the first dummy pattern in a vertical direction, and is electrically disconnected from the first semiconductor element.

10. The device of claim 1, wherein the upper die comprises:
- a second semiconductor substrate having a second device region and a second edge region therein;
- a second semiconductor element extending on the second device region of the second semiconductor substrate, such that the second pad extends on the second device region and on the second semiconductor element; and
- a second interconnection structure connecting the second semiconductor element to the second pad, said second interconnection structure comprising:
  - a third signal pattern, which extends on the second device region and is electrically connected to the second semiconductor element;
  - a fourth signal pattern, which extends on the second device region and is directly connected to the second pad; and
  - a second dummy pattern, which extends at the same level as the fourth signal pattern and extends on the second edge region.

11. The device of claim 1, wherein the upper die comprises:
- a third semiconductor substrate having a first surface and a second surface extending opposite the first surface; and
- a third semiconductor element extending on the first surface of the third semiconductor substrate; and
- wherein the second pad extends on the second surface of the third semiconductor substrate.

12. The device of claim 10, wherein a thickness of the first signal pattern is greater than a thickness of the second signal pattern.

13. A semiconductor device, comprising:

a lower structure including: (i) a first semiconductor substrate having a first device region and a first edge region, (ii) a first semiconductor element extending on the first semiconductor substrate, (iii) a first pad extending on the first semiconductor element, (iv) a first signal pattern directly connected to a bottom surface of the first pad, and (v) a first dummy pattern extending at a side of the first signal pattern; and an upper structure on the lower structure;

wherein the first semiconductor element and the first signal pattern extend on the first device region;

wherein the first dummy pattern extends on the first edge region;

wherein the upper structure and the lower structure are bonded to each other;

wherein the first pad of the lower structure and a second pad of the upper structure contact each other; and wherein the first semiconductor element and the first signal pattern are spaced apart from the first edge region.

14. The device of claim 13, wherein the lower structure further comprises a second signal pattern, which is provided on the first device region to connect the first signal pattern to the first semiconductor element; and wherein the first dummy pattern is provided at the same level as the first signal pattern.

15. The device of claim 13, wherein the first dummy pattern and the first signal pattern are spaced apart from each other; and wherein the first dummy pattern floats electrically relative to the first semiconductor element.

16. The device of claim 13, wherein the first dummy pattern extends to a region on the first device region and is connected to the first signal pattern.

17. The device of claim 13, further comprising:

a first interlayer insulating layer extending on the first semiconductor substrate to cover the first semiconductor element; and a first protection layer, which extends on the first interlayer insulating layer and exposes a top surface of the first pad; and wherein at least one of the first signal pattern or the first dummy pattern is disposed in the first interlayer insulating layer.

18. The device of claim 17, wherein a top surface of the first signal pattern and a top surface of the first dummy pattern are coplanar with a top surface of the first interlayer insulating layer.

19. The device of claim 13, wherein the upper structure comprises:

a second semiconductor substrate including a second device region and a second edge region; and a second semiconductor element extending on the second semiconductor substrate;

wherein the second pad extends on the second semiconductor element;

wherein a third signal pattern is directly connected to a bottom surface of the second pad;

wherein a second dummy pattern extends on a side of the third signal pattern;

wherein the second semiconductor element and the third signal pattern extend on the second device region;

wherein the second dummy pattern extends on the second edge region; and wherein the second semiconductor element and the third signal pattern are spaced apart from the second edge region.

20. The device of claim 13, wherein the upper structure comprises:

a second semiconductor substrate having a first surface and a second surface, which are opposite to each other; and a second semiconductor element extending on the first surface of the second semiconductor substrate; and wherein the second pad is provided on one of the first surface and the second surface of the second semiconductor substrate.

* * * * *